US012207463B2

(12) United States Patent
Byun et al.

(10) Patent No.: US 12,207,463 B2
(45) Date of Patent: Jan. 21, 2025

(54) VERTICAL NON-VOLATILE MEMORY DEVICE INCLUDING THERMOELECTRIC DEVICE, SEMICONDUCTOR PACKAGE INCLUDING THE MEMORY DEVICE, AND HEAT DISSIPATION METHOD OF THE MEMORY DEVICE

(71) Applicant: Samsung Electronics Co., Ltd., Suwon-si (KR)

(72) Inventors: Jaebeom Byun, Suwon-si (KR); Jongsam Kim, Seongnam-si (KR); Sehwan Park, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 390 days.

(21) Appl. No.: 17/487,317

(22) Filed: Sep. 28, 2021

(65) Prior Publication Data

US 2022/0238541 A1 Jul. 28, 2022

(30) Foreign Application Priority Data

Jan. 27, 2021 (KR) ........................ 10-2021-0011838

(51) Int. Cl.
*H01L 23/24* (2006.01)
*H01L 23/02* (2006.01)
(Continued)

(52) U.S. Cl.
CPC ............. *H10B 41/40* (2023.02); *H01L 23/38* (2013.01); *H10B 43/40* (2023.02)

(58) Field of Classification Search
CPC ........ H10B 43/27; H10B 41/27; H10B 41/50; H10B 43/10; H10B 43/50; H10B 41/10; H10B 43/30; H01L 23/535; H01L 23/5226
See application file for complete search history.

(56) References Cited

U.S. PATENT DOCUMENTS 6,094,919 A 8/2000 Bhatia
6,559,538 B1 5/2003 Pomerene et al.
(Continued)

FOREIGN PATENT DOCUMENTS

JP 2019201066 A 11/2019

OTHER PUBLICATIONS

Extended European Search Report dated Apr. 4, 2022 for corresponding application No. EP 21201599.4.

*Primary Examiner* — Mary A Wilczewski
*Assistant Examiner* — Tsz K Chiu
(74) *Attorney, Agent, or Firm* — Muir Patent Law, PLLC

(57) ABSTRACT

A vertical non-volatile memory device capable of stably maintaining an operating temperature in a chip level, a semiconductor package including the memory device, and a heat dissipation method of the memory device. The vertical non-volatile memory device includes a substrate on which a cell array area and an extension area are defined, a vertical channel structure formed on the substrate, a thermoelectric device including at least two semiconductor pillars formed on the substrate, and a stacked structure on the substrate. The stacked structure includes a gate electrode layer and an interlayer insulation layer which are stacked alternately along sidewalls of the vertical channel structure and the at least two semiconductor pillars. The at least two semiconductor pillars include an n-type semiconductor pillar and a p-type semiconductor pillar which are electrically connected to each other through a conductive layer on the substrate.

12 Claims, 19 Drawing Sheets

(51) Int. Cl.
  *H01L 23/38*    (2006.01)
  *H10B 41/40*    (2023.01)
  *H10B 43/40*    (2023.01)

(56) References Cited

U.S. PATENT DOCUMENTS

| | | | |
|---|---|---|---|
| 7,615,770 B2 | 11/2009 | Philipp et al. | |
| 7,893,529 B2* | 2/2011 | Hsu | H01L 23/481 |
| | | | 257/713 |
| 7,924,569 B2 | 4/2011 | Letz | |
| 8,546,924 B2 | 10/2013 | Yu et al. | |
| 8,704,205 B2* | 4/2014 | Chen | H10B 41/27 |
| | | | 257/4 |
| 8,866,309 B2 | 10/2014 | Chang et al. | |
| 9,183,000 B2 | 11/2015 | Ichida et al. | |
| 9,236,392 B1* | 1/2016 | Izumi | H10B 43/40 |
| 9,491,865 B1 | 11/2016 | Chen et al. | |
| 9,847,272 B2* | 12/2017 | Tan | H01L 25/0657 |
| 9,960,181 B1* | 5/2018 | Cui | H10B 41/50 |
| 10,249,640 B2* | 4/2019 | Yu | H01L 23/5283 |
| 10,304,852 B1* | 5/2019 | Cui | H10B 43/10 |
| 10,636,810 B2 | 4/2020 | Choi et al. | |
| 10,748,874 B2 | 8/2020 | Brewer | |
| 10,896,918 B1* | 1/2021 | Oh | H01L 21/76877 |
| 10,985,176 B2* | 4/2021 | Iwai | H10B 41/41 |
| 11,043,455 B2* | 6/2021 | Kai | H01L 21/76877 |
| 11,282,827 B2* | 3/2022 | Yun | H01L 25/18 |
| 11,495,612 B2* | 11/2022 | Tanaka | H10B 41/10 |
| 2008/0149913 A1 | 6/2008 | Tanaka et al. | |
| 2010/0155810 A1* | 6/2010 | Kim | H10B 41/27 |
| | | | 257/316 |
| 2014/0174496 A1* | 6/2014 | Park | H10N 30/87 |
| | | | 977/948 |
| 2015/0094875 A1* | 4/2015 | Duzly | G06F 13/1668 |
| | | | 700/300 |
| 2015/0179543 A1* | 6/2015 | Tan | H01L 25/0657 |
| | | | 257/713 |
| 2015/0179567 A1* | 6/2015 | Govindaraju | H01L 23/53223 |
| | | | 257/758 |
| 2016/0027730 A1* | 1/2016 | Lee | H01L 21/76816 |
| | | | 257/774 |
| 2016/0079185 A1* | 3/2016 | Kato | H10B 43/27 |
| | | | 257/314 |
| 2016/0093524 A1* | 3/2016 | Izumi | H10B 43/27 |
| | | | 438/637 |
| 2016/0126135 A1* | 5/2016 | Zhang | H01L 23/53233 |
| | | | 438/655 |
| 2016/0307912 A1* | 10/2016 | Izumi | H01L 21/76897 |
| 2016/0322374 A1* | 11/2016 | Sano | H01L 21/31051 |
| 2016/0336338 A1* | 11/2016 | Song | H10B 43/27 |
| 2016/0343612 A1* | 11/2016 | Wang | H01L 21/76856 |
| 2017/0229373 A1* | 8/2017 | Kim | H10N 10/17 |
| 2018/0358080 A1* | 12/2018 | Huang | G11C 7/04 |
| 2019/0081062 A1* | 3/2019 | Wada | H10B 43/40 |
| 2019/0229125 A1* | 7/2019 | Zhou | H10B 41/27 |
| 2019/0267333 A1* | 8/2019 | Hong | H10B 43/27 |
| 2019/0326317 A1 | 10/2019 | Jung et al. | |
| 2020/0126622 A1* | 4/2020 | Utsumi | H10B 43/40 |
| 2020/0286904 A1* | 9/2020 | Kutsukake | H10B 41/41 |
| 2021/0057443 A1* | 2/2021 | Yamamoto | H10B 43/40 |
| 2021/0288064 A1* | 9/2021 | Nishimura | H10B 41/27 |
| 2021/0296349 A1* | 9/2021 | Yoshimizu | H10B 41/20 |
| 2022/0068803 A1* | 3/2022 | Ichinose | H10B 43/10 |

\* cited by examiner

VERTICAL NON-VOLATILE MEMORY DEVICE INCLUDING THERMOELECTRIC DEVICE, SEMICONDUCTOR PACKAGE INCLUDING THE MEMORY DEVICE, AND HEAT DISSIPATION METHOD OF THE MEMORY DEVICE

CROSS-REFERENCE TO RELATED APPLICATION

This application is based on and claims priority under 35 U.S.C. § 119 to Korean Patent Application No. 10-2021-0011838, filed on Jan. 27, 2021, in the Korean Intellectual Property Office, the disclosure of which is incorporated by reference herein in its entirety.

BACKGROUND

The inventive concept relates to a vertical non-volatile memory device and a heat dissipation method of the memory device, and more particularly, to a vertical non-volatile memory device using a thermoelectric device and a heat dissipation method of the memory device.

Recently, devices using non-volatile memory devices have increased. For example, an MP3 player, a digital camera, a portable phone, a camcorder, a flash card, a solid-state disk (SSD), etc., use non-volatile memories as storage devices. Among the non-volatile memories, a flash memory electrically erases data of a cell at the same time, and thus has been widely used as a storage device in place of a hard disk. With the recent trend of increasing a storage volume, a method of efficiently using a storage space of the flash memory has been desired. Hence, a non-volatile memory device having a vertical transistor structure instead of a planar transistor structure, i.e., a three-dimensional non-volatile memory device, has been proposed.

SUMMARY

The inventive concept provides a vertical non-volatile memory device capable of stably maintaining an operating temperature in a chip level, a semiconductor package including the memory device, and a heat dissipation method of the memory device.

According to an aspect of the inventive concept, there is provided a vertical non-volatile memory device including a substrate on which a cell array area and an extension area are defined, the extension area includes an electrode pad extending from the cell array area in a first direction, a vertical channel structure formed on the substrate to extend perpendicular to a top surface of the substrate, a thermoelectric device on the substrate, the thermoelectric device including at least two semiconductor pillars extending perpendicular to the top surface of the substrate, and a stacked structure on the substrate, the stacked structure including a gate electrode layer and an interlayer insulation layer which are stacked alternately along sidewalls of the vertical channel structure and the at least two semiconductor pillars, in which the at least two semiconductor pillars include an n-type semiconductor pillar and a p-type semiconductor pillar which are electrically connected to each other through a conductive layer on the substrate.

According to another aspect of the inventive concept, there is provided a vertical non-volatile memory device including a substrate on which a cell array area and an extension area are defined, the extension area includes an electrode pad extending from the cell array area in a first direction is arranged, a vertical channel structure formed on the substrate to extend perpendicular to a top surface of the substrate, a thermoelectric device on the substrate, the thermoelectric device including at least two semiconductor pillars extending perpendicular to the top surface of the substrate, a stacked structure on the substrate, the stacked structure including a gate electrode layer and an interlayer insulation layer which are stacked alternately along sidewalls of the vertical channel structure and the at least two semiconductor pillars; and at least one temperature sensor arranged in the cell array area, on the substrate, in which the at least two semiconductor pillars include an n-type semiconductor pillar and a p-type semiconductor pillar which are electrically connected to each other through a conductive layer on the substrate, and when the temperature measured using the at least one temperature sensor exceeds a set reference temperature, the n-type semiconductor pillar is connected, through a top end thereof, to a power source and the p-type semiconductor pillar is connected, through a top end thereof, to ground, such that the thermoelectric device is turned on and heat from the substrate is dissipated through the at least two semiconductor pillars.

According to another aspect of the inventive concept, there is provided a semiconductor package including a package substrate, at least one semiconductor chip mounted on the package substrate, a connection line electrically connecting the at least one semiconductor chip to the package substrate, a sealing member sealing the at least one semiconductor chip and the connection line, in which the at least one semiconductor chip is a vertical non-volatile memory device including a semiconductor substrate, a vertical channel structure, a thermoelectric device, and a stacked structure, the thermoelectric device includes an n-type semiconductor pillar and a p-type semiconductor pillar on the semiconductor substrate and extending through the stacked structure perpendicularly to a top surface of the semiconductor substrate, and the n-type semiconductor pillar and the n-type semiconductor pillar are electrically connected to each other through a conductive layer on the semiconductor substrate.

According to another aspect of the inventive concept, there is provided a heat dissipation method of a vertical non-volatile memory device, the heat dissipation method including determining whether to maintain an operation of the thermoelectric device in the vertical non-volatile memory device, the vertical non-volatile memory device including a substrate, a vertical channel structure, a thermoelectric device, a stacked structure, and a temperature sensor, measuring a first temperature of the substrate and the stacked structure through the temperature sensor, determining whether the first temperature exceeds a set reference temperature, turning on the thermoelectric device when the first temperature exceeds the reference temperature, measuring a second temperature of the substrate and the stacked structure through the temperature sensor after a set first time period, determining whether the second temperature is less than or equal to the reference temperature, and turning the thermoelectric device off when the second temperature is less than or equal to the reference temperature, in which the thermoelectric device includes an n-type semiconductor pillar and a p-type semiconductor pillar on the substrate and extends through the stacked structure perpendicularly to a top surface of the substrate, and the n-type semiconductor pillar and the n-type semiconductor pillar are electrically connected to each other through a conductive layer on the substrate, and when the thermoelectric device is turned on, the n-type semiconductor pillar is connected, through a top end thereof, to a power source, the p-type semiconductor pillar is connected, through a top end thereof, to ground, and heat from the substrate and the stacked structure is dissipated through the n-type semiconductor pillar and the p-type semiconductor pillar.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
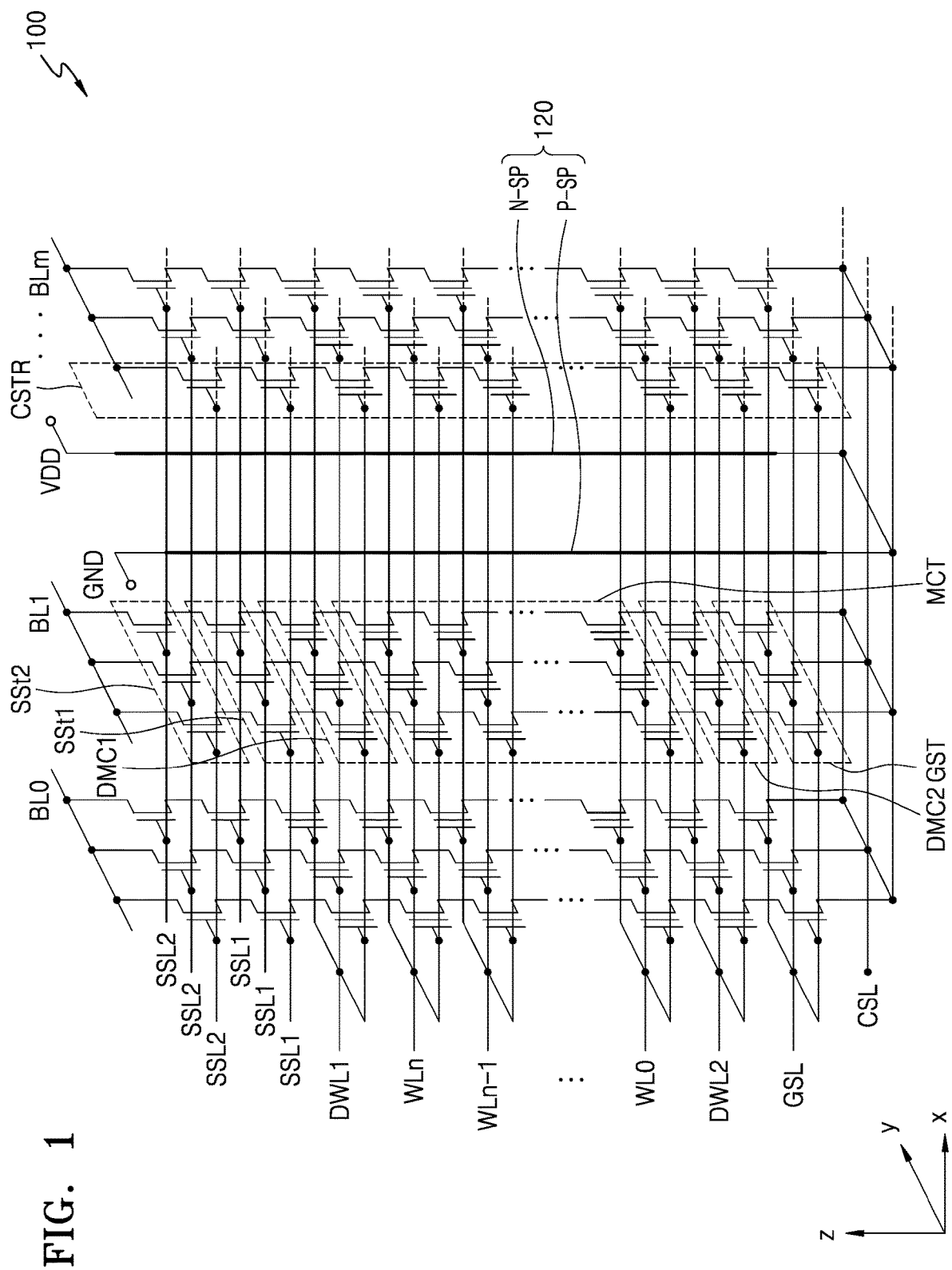
FIG. 1 is an equivalent circuit diagram of a memory cell of a vertical non-volatile memory device, according to an embodiment of the inventive concept.

Hereinafter, embodiments of the inventive concept will be described in detail with reference to the accompanying drawings. Like components in the drawings will be referred to as like reference numerals, and will not be repeatedly described.

FIG. 1 is an equivalent circuit diagram of a memory cell of a vertical non-volatile memory device, according to an embodiment of the inventive concept.

Referring to FIG. 1, a vertical non-volatile memory device 100 (hereinafter, simply referred to as a 'memory device') according to the current embodiment of the inventive concept may include a common source line CSL, a plurality of bit lines BL0 through BLm, and a plurality of cell strings CSTR. The plurality of bit lines BL0 through BLm may be arranged two-dimensionally, and the plurality of cell strings CSTR may be respectively connected to the plurality of bit lines BL0 through BLm in parallel. The plurality of cell strings CSTR may be connected in common to the common source line CSL.

Each of the cell strings CSTR may include first and second string selection transistors SSt1 and SSt2, memory cell transistors MCT, and a ground selection transistor GST. Each of the memory cell transistors MCT may include a data storage element. More specifically, the first and second string selection transistors SSt1 and SSt2 may be serially connected to each other, the second string selection transistor SSt2 may be connected to a corresponding bit line, and the ground selection transistor GST may be connected to the common source line CSL. The memory cell transistors MCT may be serially connected between the first string selection transistor SSt1 and the ground selection transistor GST. Meanwhile, according to an embodiment of the inventive concept, one string selection transistor may be arranged in each cell string CSTR.

As shown in FIG. 1, each cell string CSTR may include a first dummy cell transistor DMC1 connected between the first string selection transistor SSt1 and the memory cell transistor MCT and a second dummy cell transistor DMC2 connected between the ground selection transistor GST and the memory cell transistor MCT. However, according to an embodiment of the inventive concept, at least one of the first dummy cell transistor DCM1 or the second dummy cell transistor DMC2 may be omitted.

One cell string CSTR includes a plurality of memory cell transistors MCT having different distances from the common source line CSL, such that multi-layer word lines WL0 through WLn may be arranged between the common source line CSL and the bit lines BL0 through BLm. Gate electrodes of the memory cell transistors MCT, arranged substantially in the same distance from the common source line CSL, may be connected in common to one of the word lines WL0 through WLn and thus may be in an equipotential state. Terms such as "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The memory device 100 according to the current embodiment of the inventive concept may include a thermoelectric device 120 in a cell array area (see CAA of FIG. 2A) where the plurality of cell strings CSTR are arranged. The thermoelectric device 120 may include at least one N-type semiconductor pillar N-SP and at least one P-type semiconductor pillar P-SP. The N-type semiconductor pillar N-SP and the P-type semiconductor pillar P-SP may have a structure that is similar to a vertical channel structure (see VCS of FIG. 2A) constituting the cell string CSTR. Thus, the N-type semiconductor pillar N-SP and the P-type semiconductor pillar P-SP may have a structure extending through a stacked structure (see ST of FIG. 2B) on a substrate (see 101 of FIG. 2B) in a direction perpendicular to a top surface of the substrate 101. The N-type semiconductor pillar N-SP may be formed of an N-type semiconductor material, and the P-type semiconductor pillar P-SP may be formed of a P-type semiconductor material. For example, the N-type semiconductor pillar N-SP may be formed of polysilicon doped with N-type impurities, and the P-type semiconductor pillar P-SP may be formed of polysilicon doped with P-type impurities. Materials of the N-type semiconductor pillar N-SP and the P-type semiconductor pillar P-SP are not limited to polysilicon. For example, the N-type semiconductor pillar N-SP and the P-type semiconductor pillar P-SP may be formed of a semiconductor such as bismuth, tellurium, etc.

The N-type semiconductor pillar N-SP and the P-type semiconductor pillar P-SP may be connected, through lower portions thereof, to a conductive layer on the substrate 101, and may be electrically connected to each other through the conductive layer. The conductive layer may be, for example, the common source line CSL. When the thermoelectric device 120 operates, the N-type semiconductor pillar N-SP may be connected, through an upper portion thereof, to a power source and the P-type semiconductor pillar P-SP may be connected, through an upper portion thereof, to ground. In the memory device 100 according to the current embodiment of the inventive concept, heat generated in the substrate 101 and/or the stacked structure ST may be effectively released to the outside by an operation of the thermoelectric device 120 through the N-type semiconductor pillar N-SP and the P-type semiconductor pillar P-SP. Thus, the memory device 100 according to the current embodiment of the inventive concept may stably maintain an operating temperature in a chip level.

The detailed structure and principle of the thermoelectric device 120 will be described in more detail with reference to FIGS. 2A through 5B.

Figure 2A:
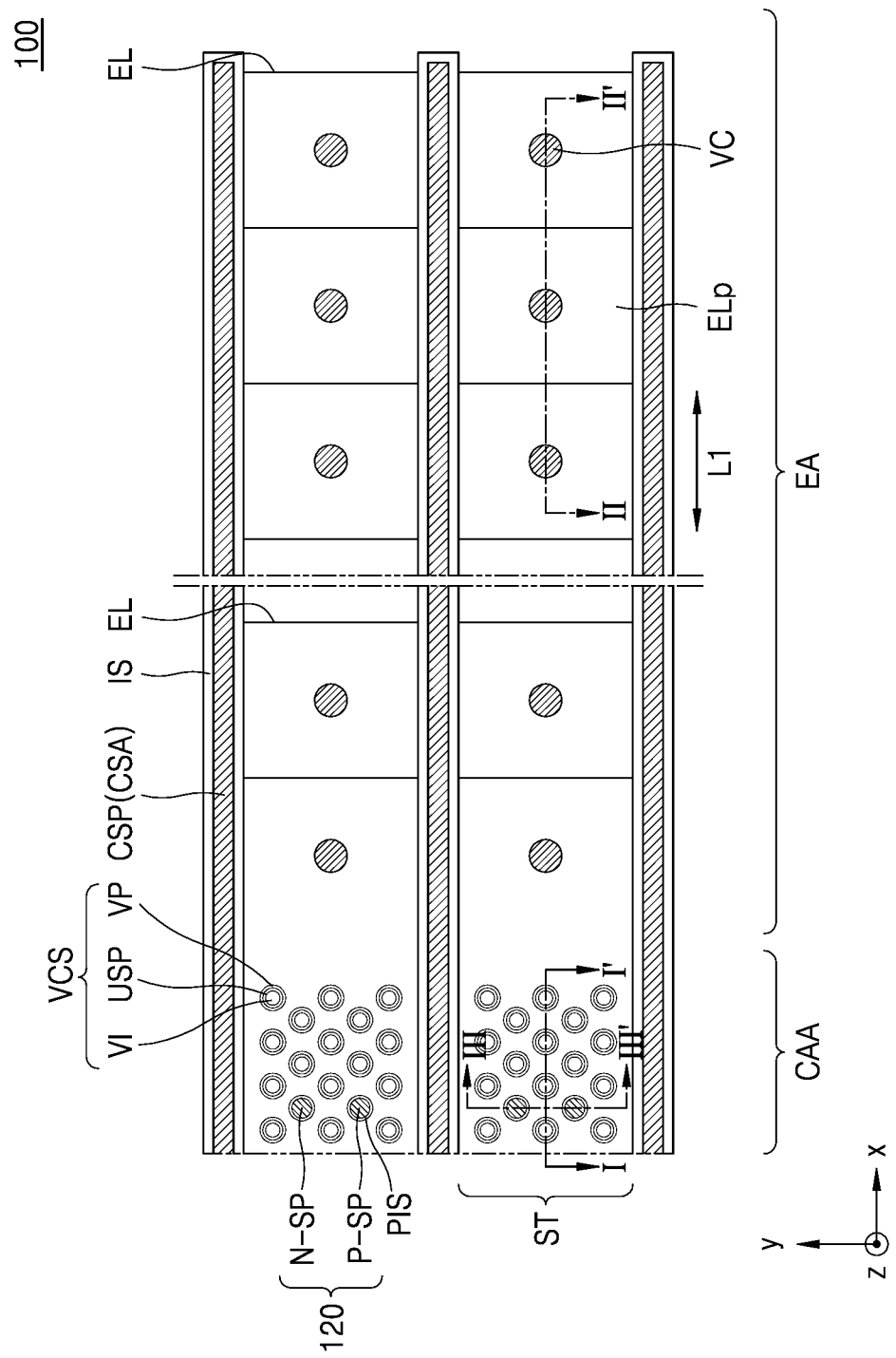
FIG. 2A is a plane view of a vertical non-volatile memory device according to an embodiment of the inventive concept.
Figure 2B:
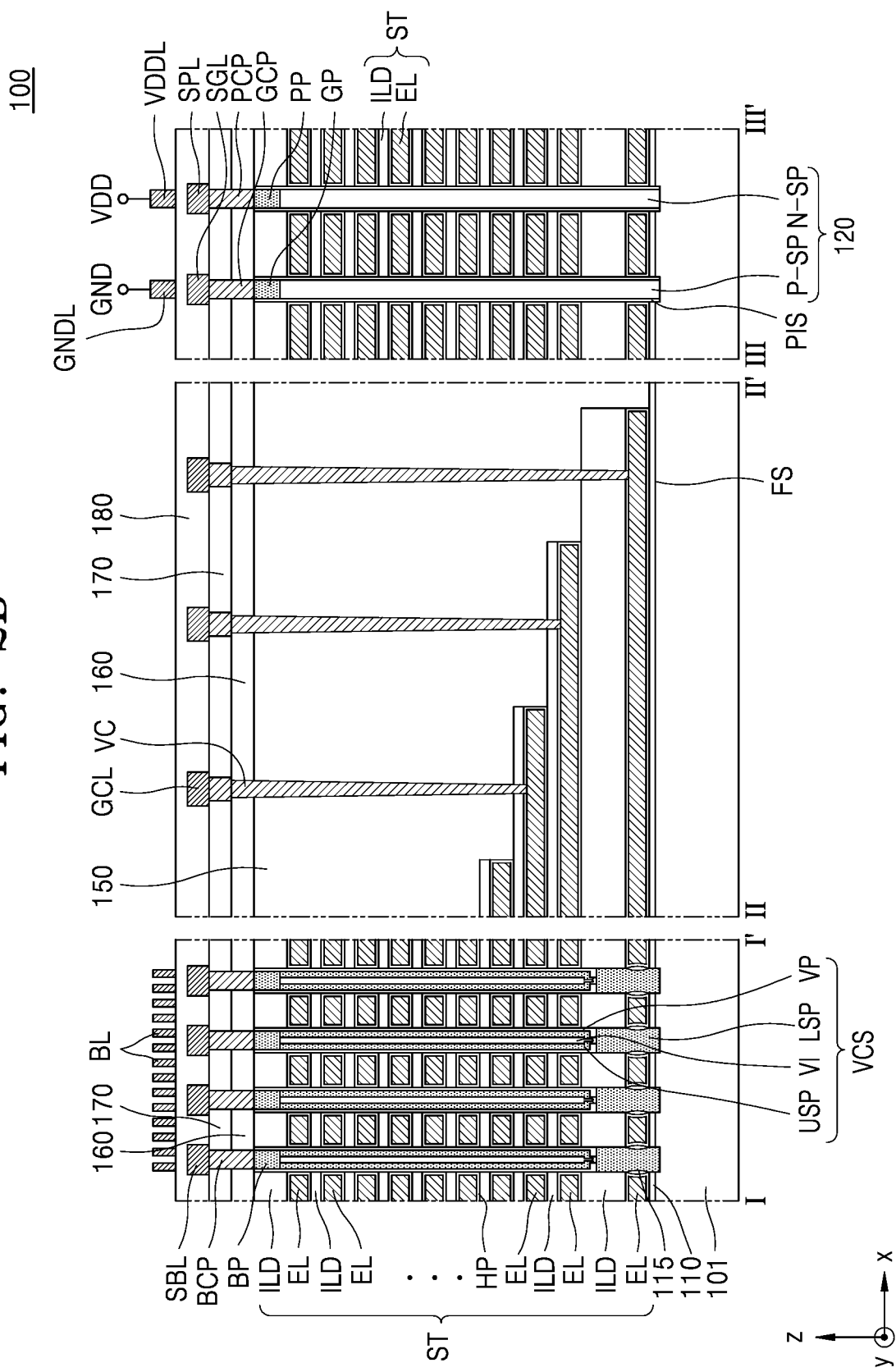
FIG. 2B is a cross-sectional view of a portion I-I', a portion II-II', and a portion III-III' taken from the vertical non-volatile memory device of FIG. 2A.

FIG. 2A is a plane view of a memory device according to an embodiment of the inventive concept, and FIG. 2B is a cross-sectional view of a portion I-I', a portion II-II', and a portion III-III' taken from the memory device of FIG. 2A. A description will be made with reference to FIGS. 2A and 2B together with FIG. 1.

Referring to FIGS. 2A and 2B, the memory device 100 according to the current embodiment of the inventive concept may include a cell array area CAA and an extension area EA which are defined on the substrate 101.

The substrate 101 may have a top surface FS extending in a first direction x and a second direction y, perpendicular to the first direction x. The substrate 101 may include a semiconductor material, for example, a Group IV-semiconductor, a Group III-V compound semiconductor, or a Group II-VI oxide semiconductor. On the substrate 101, a cell area and a peripheral area arranged outside the cell area may be defined. The cell area may include the cell array area CAA and the extension area EA.

The cell array area CAA may be an area where the string selection transistors SSt1 and SSt2, the memory cell transistor MCT, and the ground selection transistor GST, which constitute the cell strings CSTR described with reference to FIG. 1, are arranged. The plurality of bit lines BL0 through BLm may be arranged on the cell array area CAA, and impurity areas and the common source line CSL may be arranged under the cell array area CAA.

The extension area EA may be an area where an electrode pad ELp, formed by extending gate electrode layers EL of the string selection transistors SSt1 and SSt2, the memory cell transistor MCT, and the ground selection transistor GST from the cell array area CAA in the first direction x, is arranged. In the extension area EA, the electrode pad ELp may be connected to a vertical contact VC. For example, the gate electrode layer EL may form the electrode pad ELp in the extension area EA, and the stacked structure ST or the gate electrode layer EL may have a step structure in the extension area EA, as can be seen from FIG. 2B. Thus, in the extension area EA, the length of the gate electrode layer EL in the first direction x may decrease in a direction away from the substrate 101 along a third direction z (perpendicular to the first direction x and the second direction y), and the height of the stacked structure ST in the third direction z may decrease in a direction away from the cell array area CAA. Side end portions of the gate electrode layer EL may be arranged apart from each other at specific intervals in the first direction x such that a stepped shaped structure is formed.

The stacked structure ST may extend to the extension area EA in the first direction x from the cell array area CAA on the substrate 101. The stacked structure ST may be provided in plural on the substrate 101, and the stacked structures ST may be arranged apart from one another in the second direction y. For example, an isolation area extending in the first direction x may be arranged in the second direction y, and the stacked structures ST may be separated by the isolation area. Herein, the isolation area may be referred to as a word line cut area. A buffer insulation layer 110 may be between the stacked structure ST and the substrate 101.

The stacked structure ST may include a plurality of gate electrode layers EL and interlayer insulation layers ILD that are stacked alternately in the third direction z perpendicular to the top surface FS of the substrate 101. The thicknesses of the gate electrode layers EL may be substantially the same as one another. The thicknesses of the interlayer insulation layers ILD may vary with characteristics of a memory device. The thickness of the interlayer insulation layer ILD may be less than that of the gate electrode layer EL.

As described above, each gate electrode layer EL may constitute the electrode pad ELp in the extension area EA. The electrode pads ELp of the gate electrode layer EL may be in different positions horizontally and vertically. For example, the stacked structure ST may include the gate electrode layer EL and the interlayer insulation layer ILD that are stacked alternately in the third direction z, and the gate electrode layer EL constituting the electrode pad ELp in the extension area EA may have a step structure.

A planarizing insulation layer 150 may cover the stacked structure ST on the substrate 101. The planarizing insulation layer 150 may cover the step structure of the stacked structure ST in the extension area EA. The planarizing insulation layer 150 may include one insulation layer or a plurality of stacked insulation layers.

In the cell array area CAA, the plurality of vertical channel structures VCS may pass through the stacked structure ST. In the cell array area CAA, a plurality of semiconductor pillars N-SP and P-SP may pass through the stacked structure ST. Although not shown, in the extension area EA, a plurality of dummy channel structures may pass through the planarizing insulation layer 150 and the stacked structure ST.

The plurality of semiconductor pillars N-SP and P-SP may be arranged in the second direction y. The plurality of semiconductor pillars N-SP and P-SP may include at least one N-type semiconductor pillar N-SP and at least one P-type semiconductor pillar P-SP. In addition, the at least one N-type semiconductor pillar N-SP and the at least one P-type semiconductor pillar P-SP may be electrically connected to each other to constitute the thermoelectric device 120.

The plurality of semiconductor pillars N-SP and P-SP may have various arrangement structures in the cell array area CAA. For example, the plurality of semiconductor pillars N-SP and P-SP may be arranged in at least one pair of two in one block along the first direction x. As shown in FIG. 2A, the pair of two may be arranged in the second direction y. According to an embodiment of the inventive concept not illustrated, the plurality of semiconductor pillars N-SP and P-SP may be arranged in at least one pair of three or more in one block along the first direction x. The pair of three or more may be arranged in the second direction y. According to an embodiment of the inventive concept, at least one of the plurality of semiconductor pillars N-SP and P-SP may be arranged in one block along the first direction x.

In the third direction z, bottom surfaces of the vertical channel structure VCS and the semiconductor pillars N-SP and P-SP may be in substantially the same level. The vertical channel structure VCS and the semiconductor pillars N-SP and P-SP may have substantially the same length in the third direction z. This is because a through-hole for the vertical channel structure VCS and through-holes for the semiconductor pillars N-SP and P-SP may be formed through similar processes or the same process.

The vertical channel structure VCS may include a lower semiconductor pattern LSP, an upper semiconductor pattern USP, a data storage pattern VP, and a buried insulation pattern VI. The lower semiconductor pattern LSP may contact the substrate 101 and may include an epitaxial layer in the shape of a pillar growing from the substrate 101. A gate insulation layer 115 may be arranged in a part of a sidewall of the lower semiconductor pattern LSP. The upper semiconductor pattern USP may contact the lower semiconductor pattern LSP. The inside of the upper semiconductor pattern USP may be filled with the buried insulation pattern VI including an insulation material. The lower semiconductor pattern LSP and the upper semiconductor pattern USP may be electrically connected to each other by passing through the data storage pattern VP. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The data storage pattern VP may be arranged between the stacked structure ST and the upper semiconductor pattern USP. The data storage pattern VP may extend in the third direction z and surround a sidewall of the upper semiconductor pattern USP. The data storage pattern VP may include one thin film or a plurality of thin films. In embodiments of the inventive concept, the data storage pattern VP, which is a data storage film of a NAND flash memory device, may include a tunnel insulation layer, a charge storage film, and a blocking insulation layer. A structure of the data storage pattern VP will be described in more detail in a description of the vertical channel structure VCS of FIG. 4A.

A horizontal insulation pattern HP may extend to top surfaces and bottom surfaces of the gate electrode layer EL between the gate electrode layer EL and the vertical channel structure VCS. The horizontal insulation pattern HP as a part of the data storage film of the NAND flash memory device may include the charge storage film and the blocking insulation layer. However, the horizontal insulation pattern HP may include the blocking insulation layer.

The semiconductor pillars N-SP and P-SP may include a semiconductor layer in the shape of a pillar extending in the third direction z from the substrate 101. For example, the N-type semiconductor pillar N-SP may include an N-type semiconductor layer in the shape of a pillar and the P-type semiconductor pillar P-SP may include a P-type semiconductor layer in the shape of a pillar. The semiconductor layer may be formed of, for example, doped polysilicon. A material of the semiconductor layer is not be limited to polysilicon. According to an embodiment of the inventive concept, the semiconductor pillars N-SP and P-SP may include an epitaxial layer such as the lower semiconductor pattern LSP of the vertical channel structure VCS. In this case, the semiconductor pillars N-SP and P-SP may have a structure including an epitaxial layer and a semiconductor layer on the epitaxial layer. Meanwhile, side surfaces of the semiconductor pillars N-SP and P-SP may be surrounded by a pillar insulation layer PIS. Thus, the semiconductor pillars N-SP and P-SP may be electrically insulated from the gate electrode layer EL of the stacked structure ST by the pillar insulation layer PIS. Structures of the semiconductor pillars N-SP and P-SP and the pillar insulation layer PIS will be described in more detail in a description of the semiconductor pillars N-SP and P-SP to be made with reference to FIG. 4B.

A bit line electrode pad BP and a bit line contact plug BCP connected thereto may be on a top end of the upper semiconductor pattern USP. A side surface of the bit line electrode pad BP may be surrounded by the data storage pattern VP. According to an embodiment of the inventive concept, the bit line electrode pad BP may be on a top surface of the upper semiconductor pattern USP and a top surface of the data storage pattern VP, and a side surface of the bit line electrode pad BP may be surrounded by a first upper interlayer insulation layer 160.

A power pad PP and a ground pad GP and a power contact plug PCP and a ground contact plug GCP respectively connected thereto may be on top ends of the semiconductor pillars N-SP and P-SP. Side surfaces of the power pad PP and the ground pad GP may be surrounded by the pillar insulation layer PIS. According to an embodiment of the inventive concept, the power pad PP and the ground pad GP may be on the top surfaces of the semiconductor pillars N-SP and P-SP and a top surface of the pillar insulation layer PIS, and the side surfaces of the power pad PP and the ground pad GP may be surrounded by the first upper interlayer insulation layer 160.

A common source area CSA may extend in the first direction x in parallel with the stacked structures ST, and may be formed by doping the substrate 101 with impurities. A common source plug CSP may be connected to the common source area CSA between the stacked structures ST. In FIG. 2A, the common source area CSA may be arranged under a common source plug CSP in the third direction z. The common source area CSA may constitute a part of the common source line CSL. An insulation spacer IS may be arranged on opposite side surfaces of the common source plug CSP. For example, the insulation spacer IS may be between the common source plug CSP and the stacked structures ST. According to an embodiment of the inventive concept, the common source plug CSP may be arranged in a part on the common source area CSA, and an isolating insulation layer may be arranged on the common source plug CSP. The common source plug CSP, the insulation spacer IS, the isolating insulation layer, etc., may be arranged in the above-described isolation area.

The first upper interlayer insulation layer 160 may be arranged on the planarizing insulation layer 150 in the extension area EA. The first upper interlayer insulation layer 160 may constitute an interlayer insulation layer ILD in the cell array area CAA, and may cover a top surface of the vertical channel structure VCS and the top surfaces of the semiconductor pillars N-SP and P-SP. The second upper interlayer insulation layer 170 may be arranged on the first upper interlayer insulation layer 160.

In the extension area EA, the vertical contact VC may contact the electrode pad ELp of the gate electrode layer EL by passing through the first and second upper interlayer insulation layers 160 and 170 and the planarizing insulation layer 150. A vertical length, i.e., a length in the third direction z, of the vertical contact VC may decrease toward the cell array area CAA. Top surfaces of the vertical contacts VC may be formed on substantially the same plane.

A sub bit line SBL may be arranged on the second upper interlayer insulation layer 170 in the cell array area CAA, and may be electrically connected to the vertical channel structure VCS through the bit line contact plug BCP. A sub power line SPL and a sub ground line SGL may be arranged on the second upper interlayer insulation layer 170 in the cell array area CAA, and may be electrically connected to the semiconductor pillars N-SP and P-SP through the power contact plug PCP and the ground contact plug GCP. In the extension area EA, a gate connection line GCL may be arranged on the second upper interlayer insulation layer 170 and may be electrically connected to the electrode pad ELp through the vertical contact VC.

A third upper interlayer insulation layer 180 may be arranged on the second upper interlayer insulation layer 170 and may cover the sub bit line SBL, the sub power line SPL and the sub ground line SGL, and the gate connection line GCL. The bit line BL, a power line VDDL, and a ground line GNDL may be arranged on the third upper interlayer insulation layer 180, and may extend in the second direction y across the stacked structure ST. Although not shown, the bit lines BL may be connected to the sub bit lines SBL through a contact, and the power line VDDL and the ground line GNDL may be respectively connected to the sub power line SPL and the sub ground line SGL through a contact. According to an embodiment of the inventive concept, the power line VDDL and the ground line GNDL may be directly and respectively connected to the sub power line SPL and the sub ground line SGL without a separate contact.

When the thermoelectric device 120 operates, power may be applied to the N-type semiconductor pillar N-SP through the power line VDDL, the sub power line SPL, the power contact plug PCP, and the power pad PP, and the ground may be applied to the P-type semiconductor pillar P-SP through the ground line GNDL, the sub ground line SGL, the ground contact plug GCP, and the ground pad GP. Meanwhile, a connection structure of the semiconductor pillars N-SP and P-SP with the power line VDDL and the ground line GNDL may vary according to an arrangement structure of the semiconductor pillars N-SP and P-SP. The connection structure of the semiconductor pillars N-SP and P-SP with the power line VDDL and the ground line GNDL will be described in more detail with reference to FIGS. 5A and 5B.

Contacts and lines PP, GP, PCP, GCP, SPL, SGL, VDDL, and GNDL on the semiconductor pillars N-SP and P-SP may have substantially the same structure as the contacts and the lines BP, BCP, SBL, and BL on the vertical channel structure VCS except that the power line VDDL and the ground line GNDL are isolated from each other. In a simplification of a process, the contacts and the lines PP, GP, PCP, GCP, SPL, SGL, VDDL, and GNDL on the semiconductor pillars N-SP and P-SP are formed when the contacts and the lines BP, BCP, SBL, and BL on the vertical channel structure VCS are formed. However, according to an embodiment of the inventive concept, the contacts and the lines on the semiconductor pillars N-SP and P-SP may be formed separately from the contacts and the lines BP, BCP, SBL, and BL on the vertical channel structure VCS. In this case, at least two adjacent ones among the power pad PP, the power contact plug PCP, and the sub power line SPL may be formed as one contact structure by being integrally connected to each other. Also, at least two adjacent ones among the ground pad GP, the ground contact plug GCP and the sub ground line SGL may be formed as one contact structure by being integrally connected to each other. For example, the power pad PP, the power contact plug PCP, and the sub power line SPL may be formed as one integrated contact, the power line VDDL may be directly connected to the N-type semiconductor pillar N-SP through the integrated contact. Also the ground pad GP, the ground contact plug GCP, and the sub ground line SGL may be formed as one integrated contact, the ground line GNDL may be directly connected to the P-type semiconductor pillar P-SP through the integrated contact.

The memory device 100 according to the current embodiment of the inventive concept may have a multi-stack structure formed through a multi-stack process. Herein, the multi-stack process may be a process in which as the height of the vertical non-volatile memory device in the vertical direction increases, it becomes difficult to form holes passing through a mold structure to the substrate at one time, such that a mold structure is formed in a divided manner two or more times and a through-hole for a vertical channel structure and the vertical channel structure are formed in a divided manner for each mold structure. When the memory device 100 according to the current embodiment of the inventive concept has a multi-stack structure, the semiconductor pillars N-SP and P-SP may be formed in a divided manner for each mold structure like the vertical channel structure.

Figure 3A:
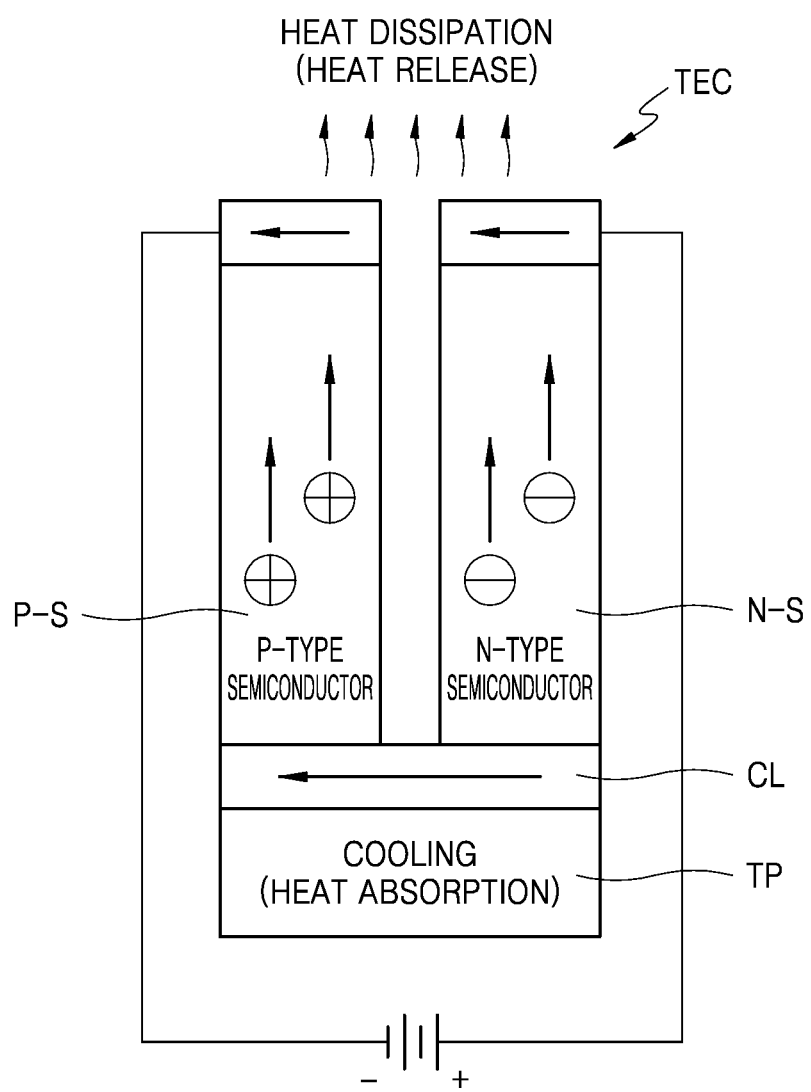
FIGS. 3A through 3C are conceptual views for describing a heat dissipation operation using a thermoelectric device in the vertical non-volatile memory device of FIG. 2A.
Figure 3B:
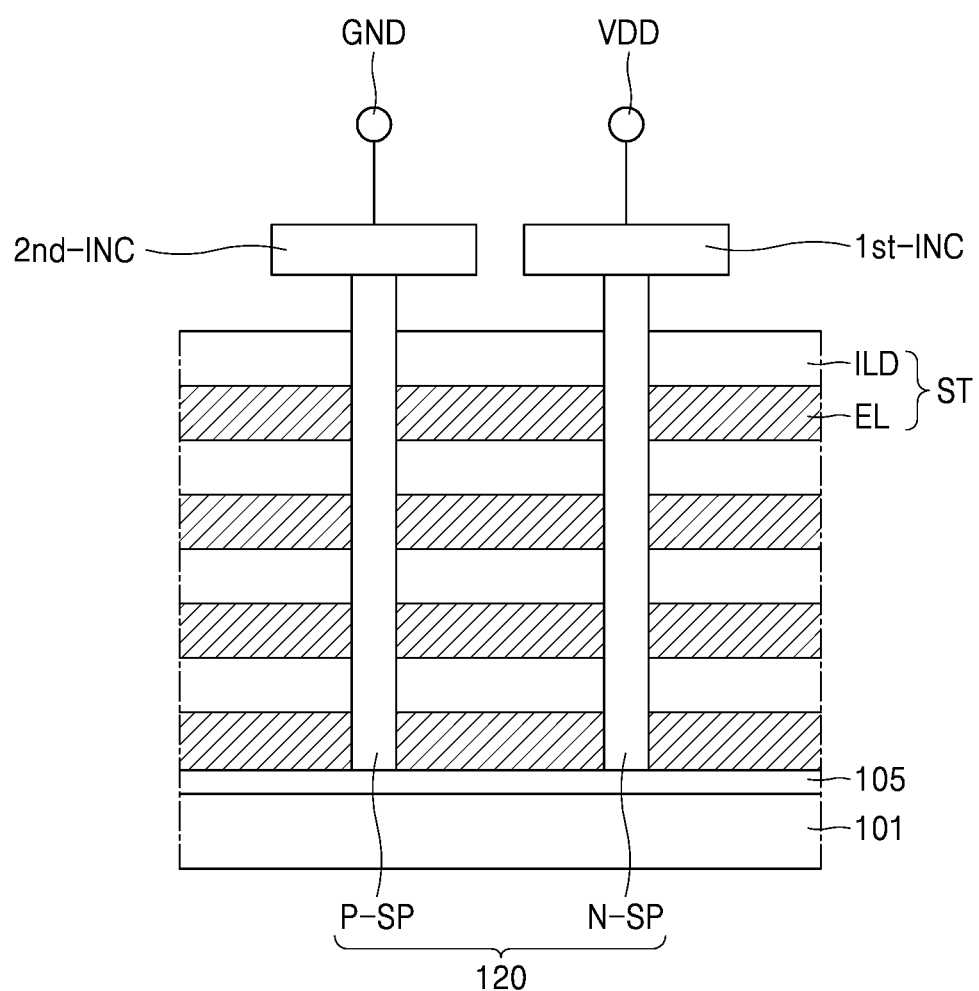
Figure 3C:
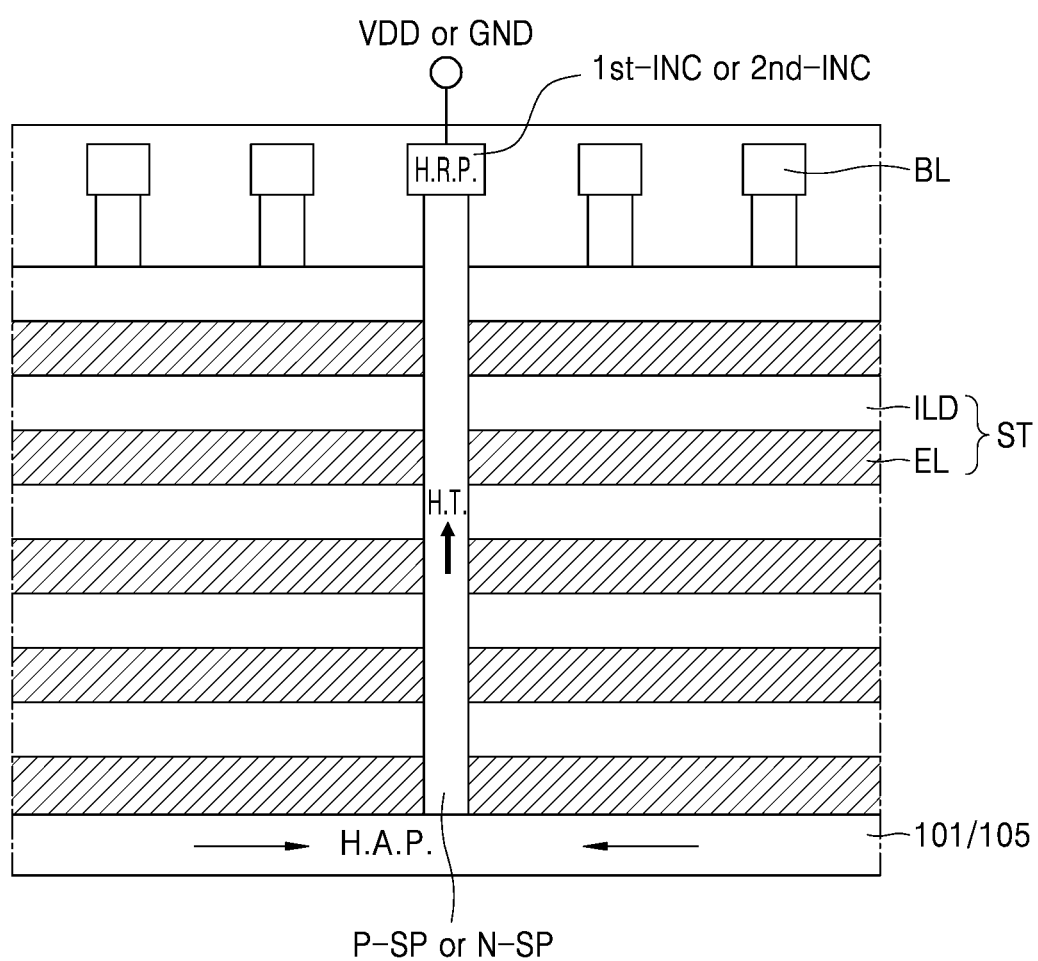

FIGS. 3A through 3C are conceptual views for describing a heat dissipation operation using a thermoelectric device in the memory device of FIG. 2A.

Referring to FIGS. 3A through 3C, in general, the thermoelectric device may be any device using various effects obtained by interaction between heat and electricity. The thermoelectric device may include a thermistor device which is a device using a temperature change of an electric resistance, a device using a Seebeck effect which is a phenomenon where an electromotive force is generated by a temperature difference, a Peltier device using the Peltier effect which is a phenomenon where absorption (or generation) of heat occurs by electric current, etc.

The Peltier effect is a phenomenon where when two types of metals are connected and current flows therethrough, heat absorption occurs in a terminal of a side and heat generation occurs in a terminal of the other side depending on the direction of the current. Semiconductors such as bismuth, tellurium, etc., having different electric conduction schemes may be used. Alternatively, a P-type semiconductor and an N-type semiconductor may be used, in place of the two types of the metals, and a Peltier device having high efficiency may be implemented through combinations of various semiconductors. The Peltier device is capable of switching between heat absorption and heat generation depending on the direction of the current, and adjusting the amount of heat absorption and the amount of heat generation according to the amount of current. The Peltier device may thus be applicable to manufacturing of a cooling device (e.g., a refrigerator) with a small capacity or a thermostat.

In the memory device 100 according to the current embodiment of the inventive concept, the thermoelectric device 120 may be a Peltier device using the Peltier effect. The thermoelectric device 120 may correspond to a thermoelectric cooler (TEC) that absorbs heat in a certain part through voltage application and dissipates heat to the outside.

Describing in more detail an operation of the TEC that is a thermoelectric device with reference to FIG. 3A, the TEC may include a P-type semiconductor P-S and an N-type semiconductor N-S which may be electrically connected to each other by contacting the conductive layer CL through an end of any one side, e.g., a lower end thereof. The conductive layer CL may include, for example, metal. However, a material of the conductive layer CL is not limited to metal. For example, the conductive layer CL may include semiconductor, metal oxide, metal silicide, etc., having conductivity. When the TEC operates, a target portion TP, which is a cooling target, may be arranged adjacent to the conductive layer CL, and the P-type semiconductor P-S and the N-type semiconductor N-S may be connected to the power source and the ground through an end of the other side, e.g., a top end thereof. More specifically, the P-type semiconductor P-S may be connected to the ground, and the N-type semiconductor N-S may be connected to the power source. Based on such a connection relationship, carriers of the N-type semiconductor N-S, i.e., electrons, may move to the power source and carriers of the P-type semiconductor P-S, i.e., holes, may move to the ground. Heat may be absorbed in the target portion TP for cooling due to movement of the carriers, and heat may be dissipated by being transferred to the power source and the ground through the P-type semiconductor P-S and the N-type semiconductor N-S.

FIG. 3B conceptually shows the thermoelectric device 120 that operates as the TEC in the memory device 100 according to the current embodiment of the inventive concept. More specifically, the thermoelectric device 120 may include an N-type semiconductor pillar N-SP and a P-type semiconductor pillar P-SP. The N-type semiconductor pillar N-SP and the P-type semiconductor pillar P-SP may extend in a cylindrical shape passing through the stacked structure ST on the substrate 101. Each of the N-type semiconductor pillar N-SP and the P-type semiconductor pillar P-SP may contact, through a lower end thereof, a common source line 105 corresponding to the conductive layer. Thus, the N-type semiconductor pillar N-SP and the P-type semiconductor pillar P-SP may be electrically connected to each other through the common source line 105. The substrate 101 may be arranged under the common source line 105.

When the thermoelectric device 120 operates, the N-type semiconductor pillar N-SP may be connected to the power source VDD through a first internal connection line 1st-INC and the P-type semiconductor pillar P-SP may be connected to the ground GND through a second internal connection line 2nd-INC. Describing a relationship of line connection to the outside of a chip with reference to FIG. 8, the first internal connection line 1st-INC may be connected to the power source VDD of a main board through a chip pad 190 of the memory device 100, an external connection line 300, a substrate pad 210, an internal line 220 of a package substrate 200, and an external connection terminal 250, and the second internal connection line 2nd-INC may be connected to the ground GND of the main board through the chip pad 190 of the memory device 100, the external connection line 300, the substrate pad 210, the internal line 220 of the package substrate 200, and the external connection terminal 250. Herein, the first internal connection line 1st-INC may include, for example, the power pad PP, the power contact plug PCP, the sub power line SPL, and the power line VDDL, and the second internal connection line 2nd-INC may include, for example, the ground pad PGP, the ground contact plug GCP, the sub ground line SGL, and the ground line GNDL.

Based on the arrangement and connection relationship of the thermoelectric device 120, as can be seen in FIG. 3C, the thermoelectric device 120 may absorb heat of the substrate 101 and the common source line 105, i.e., a heat absorption part (H.A.P.), perform heat transfer (H.T.) through the semiconductor pillars N-SP and P-SP, and release heat through the first and second internal connection lines 1st-INC and 2nd-INC, i.e., a heat release part (H.R.P.), thereby cooling the substrate 101 and the common source line 105. The thermoelectric device 120 may also release heat of the stacked structure ST adjacent to side surfaces of the semiconductor pillars N-SP and P-SP as well as heat of the substrate 101 and the common source line 105 corresponding to the H.A.P., for cooling.

Heat release in the H.R.P. side may occur more actively in the outside of the chip than in the first and second internal connection lines 1st-INC and 2nd-INC inside the chip. For example, an external connection terminal (see 250 of FIG. 8) such as a solder ball arranged on a bottom surface of a package substrate (see 200 of FIG. 8) connected to the power source VDD and the ground GND may be connected to a substrate having a wide contact area with an air, and thus, heat release may relatively actively occur therein.

Figure 4A:
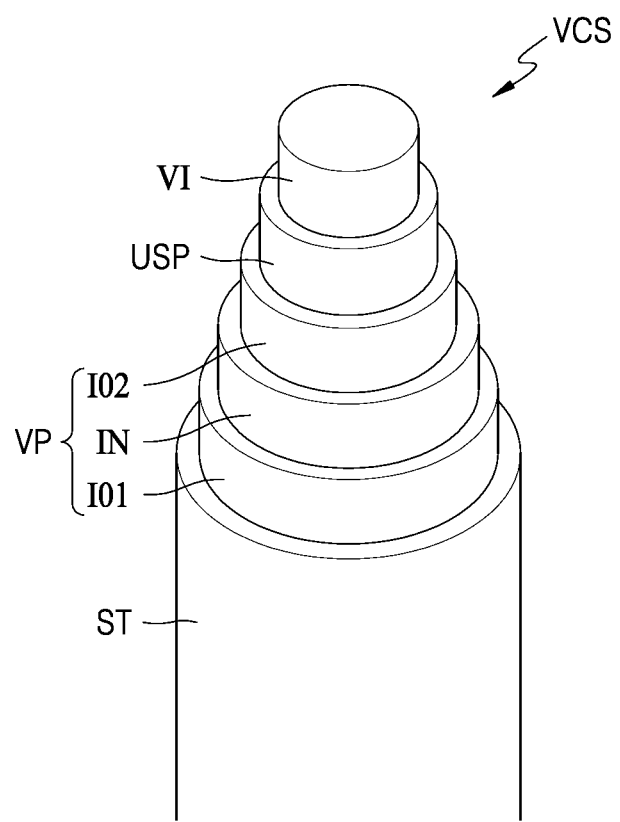
FIGS. 4A and 4B are perspective views of a vertical channel structure and a thermoelectric device in the vertical non-volatile memory device of FIG. 2A.
Figure 4B:
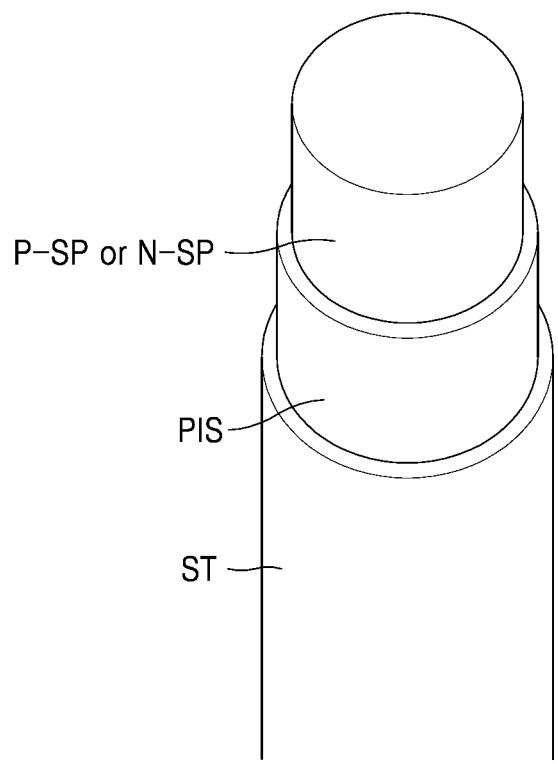

FIGS. 4A and 4B are perspective views of a vertical channel structure and a thermoelectric device in the memory device of FIG. 2A. A description already made with reference to FIGS. 1 through 3C will be simplified or omitted.

Referring to FIG. 4A, in the memory device 100 according to the current embodiment of the inventive concept, the vertical channel structure VCS may have a cylindrical shape passing through the stacked structure ST. However, the shape of the vertical channel structure VCS is not limited to a cylindrical shape. For example, the vertical channel structure VCS may have a polygonal or elliptic cylindrical shape. Although the stacked structure ST is illustrated in FIG. 4A in the shape of a circular tube for convenience, actually, the stacked structure ST may be a structure in which the plurality of gate electrode layers EL and the plurality of interlayer insulation layers ILD are stacked alternately in the third direction z and extend in the first direction x and in the second direction y, as shown in FIG. 2B.

The vertical channel structure VCS may include the upper semiconductor pattern USP, the data storage pattern VP, and the buried insulation pattern VI. As shown in FIG. 4A, the buried insulation pattern VI may have a cylindrical shape and each of the upper semiconductor pattern USP and the data storage pattern VP may have a circular tube shape.

The data storage pattern VP may include ONO insulation layers, e.g., a first oxide insulation layer IO1, a nitride insulation layer IN, and a second oxide insulation layer 102. Each of the first oxide insulation layer IO1, the nitride insulation layer IN, and the second oxide insulation layer IO2 may have a circular tube shape. The first oxide insulation layer IO1 and the second oxide insulation layer IO2 may be formed of, e.g., silicon oxide $SiO_2$, and the nitride insulation layer IN may be formed of, e.g., silicon nitride SiNx. The shapes and materials of the first oxide insulation layer IO1, the second oxide insulation layer IO2, and the nitride insulation layer IN are not limited to the above-described shapes and materials.

Referring to FIG. 4B, in the memory device 100 according to the current embodiment of the inventive concept, the semiconductor pillars N-SP and P-SP may have a cylindrical shape passing through the stacked structure ST. However, the shape of the semiconductor pillars N-SP and P-SP is not limited to a cylindrical shape. For example, the semiconductor pillars N-SP and P-SP may have a polygonal or elliptic cylindrical shape. In FIG. 4B, the stacked structure ST is illustrated in the shape of a circular tube for convenience.

The side surfaces of the semiconductor pillars N-SP and P-SP may be surrounded by the pillar insulation layer PIS. For example, the pillar insulation layer PIS may have a circular tube shape surrounding the side surfaces of the semiconductor pillars N-SP and P-SP. Thus, the semiconductor pillars N-SP and P-SP may be electrically insulated from the gate electrode layers EL of the stacked structure ST by the pillar insulation layer PIS.

The semiconductor pillars N-SP and P-SP may be formed through a process that is similar to that of the vertical channel structure VCS. For example, through-holes for the semiconductor pillars N-SP and P-SP may be formed and filled with the pillar insulation layer PIS and a material layer for the semiconductor pillars N-SP and P-SP, thereby forming the semiconductor pillars N-SP and P-SP. Herein, the pillar insulation layer PIS may be formed of, for example, silicon oxide $SiO_2$. However, a material of the pillar insulation layer PIS is not limited thereto. The semiconductor pillars N-SP and P-SP and the vertical channel structure VCS may be formed through different processing phases because of different material layers. However, according to an embodiment of the inventive concept, the through-hole for the vertical channel structure VCS and the through-holes for the semiconductor pillars N-SP and P-SP may be formed through the same process phase.

Figure 5A:
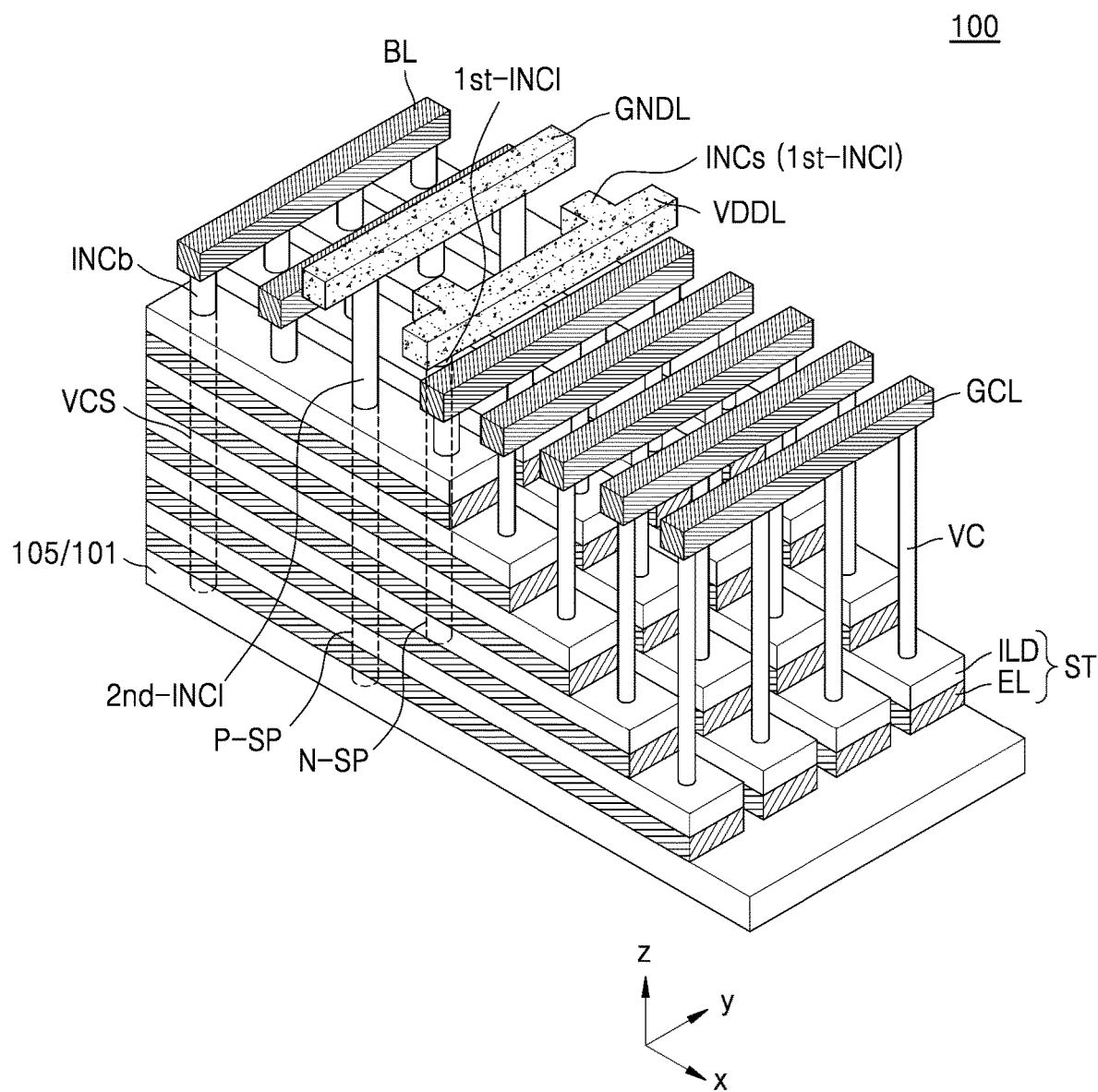
FIGS. 5A and 5B are perspective views of a line connection structure in a top end of a thermoelectric device in the vertical non-volatile memory device of FIG. 2A.
Figure 5B:
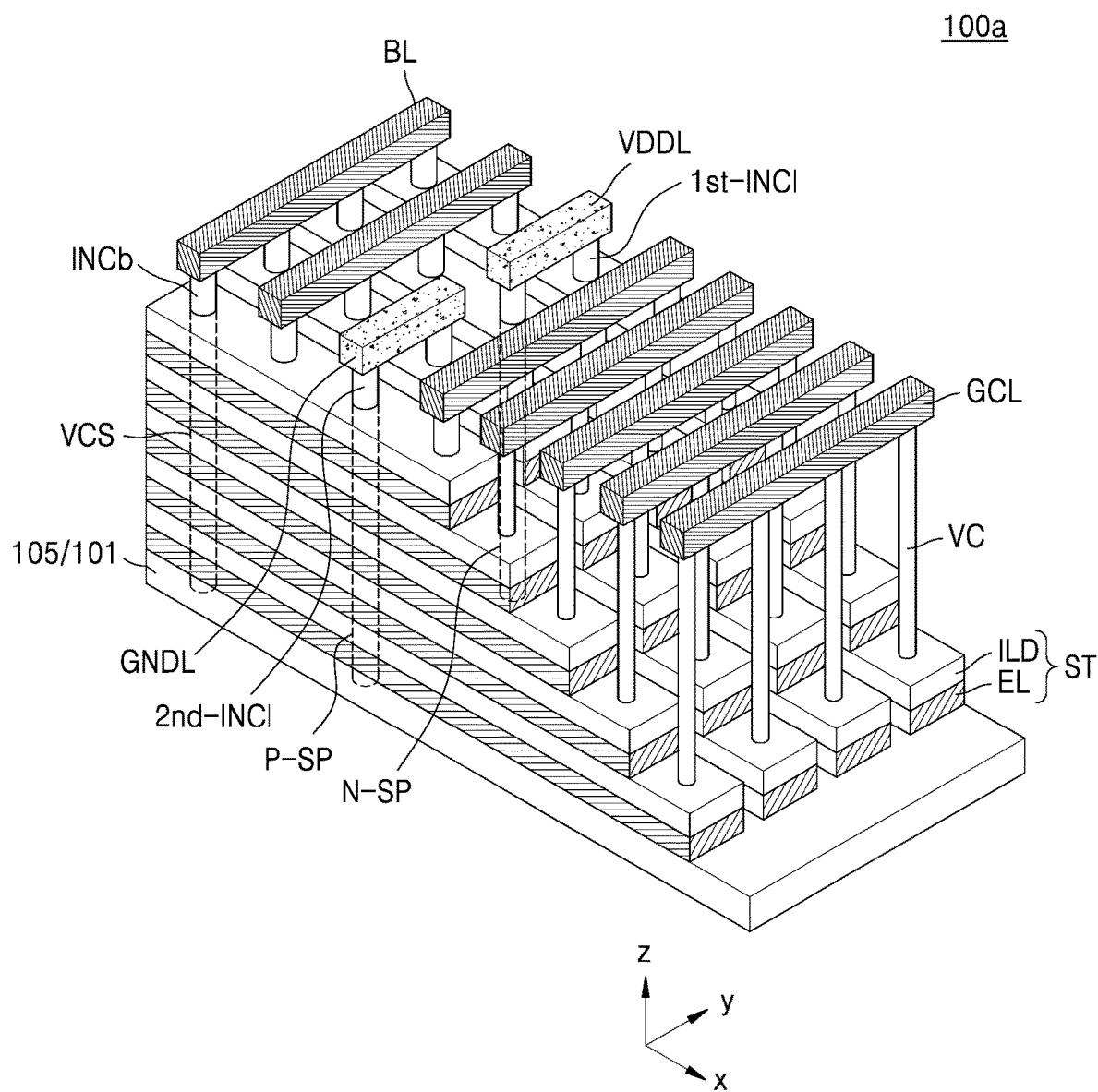

FIGS. 5A and 5B are perspective views of a line connection structure in a top end of a thermoelectric device in the memory device of FIG. 2A. A description already made with reference to FIGS. 1 through 4B will be simplified or omitted.

Referring to FIG. 5A, in the memory device 100 according to the current embodiment of the inventive concept, the vertical channel structure VCS may be connected to the bit line BL through a bit line connection line INCb, and the semiconductor pillars N-SP and P-SP may be connected to the power line VDDL and the ground line GNDL through the first and second lower connection lines 1st-INCI and 2nd-INCI. In the extension area EA, the gate connection line GCL may be connected to the electrode pad ELp including the gate electrode layer EL of the stacked structure ST through the vertical contact VC.

The bit line connection line INCb may include, for example, the bit line electrode pad BP, the bit line contact plug BCP, the sub bit line SBL, etc. In FIG. 5A, for convenience, the bit line connection line INCb is illustrated simply in the shape of a pillar. The first and second lower connection lines 1st-INCI and 2nd-INCI may include the power and ground pads PP and GP, the power and ground contact plugs PCP and GCP, the sub power and sub ground lines SPL and SGL, etc.

In the memory device 100, according to the current embodiment of the inventive concept, the semiconductor pillars N-SP and P-SP may be arranged alternately in the second direction y. The N-type semiconductor pillar N-SP may be connected to the power line VDDL through a first lower connection line 1st-INCI, and the P-semiconductor pillar P-SP may be connected to the ground line GNDL through the second lower connection line 2nd-INCI. As shown in FIG. 5A, the power line VDDL may be arranged in a position lower than the ground line GNDL in the third direction z. Thus, a contact on a top part of the second lower connection line 2nd-INCI may be longer than that of the first lower connection line 1st-INCI, or the second lower connection line 2nd-INCI may further include an additional contact. The first lower connection line 1st-INCI may include a side connection line INCs connected to the power line VDDL in a side surface direction. According to an embodiment of the inventive concept, the power line VDDL may be arranged in a position higher than the ground line GNDL in the third direction z. In this case, the first lower connection line 1st-INCI may include the side connection line INCs connected to the ground line GNDL in the side surface direction.

In the memory device 100 according to the current embodiment of the inventive concept, the N-type semiconductor pillar N-SP and the P-type semiconductor pillar P-SP may be arranged alternately in the second direction y. However, as the power line VDDL and the ground line GNDL are arranged to different heights in the third direction z, the N-type semiconductor pillar N-SP may be connected in common to the power line VDDL and the P-type semiconductor pillar P-SP may be connected in common to the ground line GNDL. As a result, in the memory device 100 according to the current embodiment of the inventive concept, as the thermoelectric device 120 including a pair of the N-type semiconductor pillar N-SP and the P-type semiconductor pillar P-SP is arranged in plural in the second direction y, a heat dissipation effect obtained by the thermoelectric device 120 may be uniform and maximized over the entire cell array area CAA.

Referring to FIG. 5B, a memory device 100a according to the current embodiment of the inventive concept may be different from the memory device 100 of FIG. 5A in that the N-type semiconductor pillar N-SP and the P-type semiconductor pillar P-SP are arranged collectively for the same conductive type in the second direction y, and the power line VDDL and the ground line GNDL are arranged in substantially the same position in the third direction z. More specifically, in the memory device 100a according to the current embodiment of the inventive concept, the power line VDDL and the ground line GNDL may be arranged in substantially the same position in the third direction z, the N-type semiconductor pillar N-SP may be connected to the power line VDDL through the first lower connection line 1st-INCI, and the P-semiconductor pillar P-SP may be connected to the ground line GNDL through the second lower connection line 2nd-INCI. The first lower connection line 1st-INCI and the second lower connection line 2nd-INCI may have substantially the same line structure. For example, the first lower connection line 1st-INCI may include, for example, the power pad PP, the power contact plug PCP, the sub power line SPL, etc., and the second lower connection line 2nd-INCI may include, for example, the ground pad GP, the ground contact plug GCP, the sub ground line SGL, etc.

In the memory device 100a according to the current embodiment of the inventive concept, the N-type semiconductor pillar N-SP and the P-type semiconductor pillar P-SP may be arranged collectively for the same conductive type in the second direction y. Based on the arrangement structure of the semiconductor pillars N-SP and P-SP, the power line VDDL and the ground line GNDL may be arranged to substantially the same height in the third direction z, and the N-type semiconductor pillar N-SP may be connected in common to the power line VDDL and the P-type semiconductor pillar P-SP may be connected in common to the ground line GNDL. As a result, in the memory device 100a according to the current embodiment of the inventive concept, the entire N-type semiconductor pillar N-SP and the entire P-type semiconductor pillar P-SP may constitute one thermoelectric device 120. In addition, in the memory device 100a according to the current embodiment of the inventive concept, the power line VDDL and the ground line GNDL may be arranged in substantially the same position in the third direction z and the first lower connection line 1st-INCI and the second lower connection line 2nd-INCI may have substantially the same line structure, such that the line structure may be simplified and thus a wiring process on the semiconductor pillars N-SP and P-SP may be facilitated.

Figure 6A:
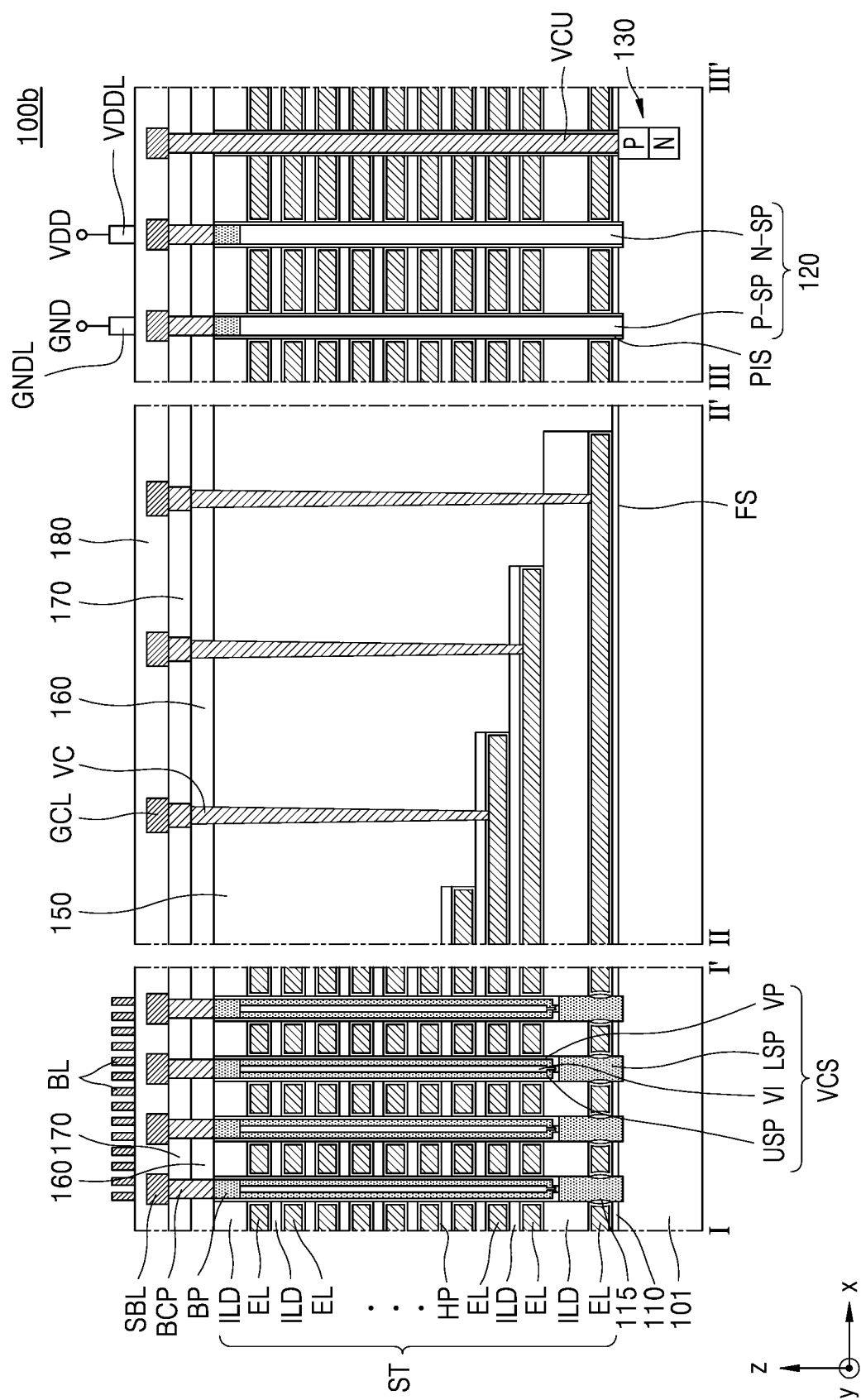
FIGS. 6A and 6B are cross-sectional views of a vertical non-volatile memory device according to embodiments of the inventive concept.
Figure 6B:
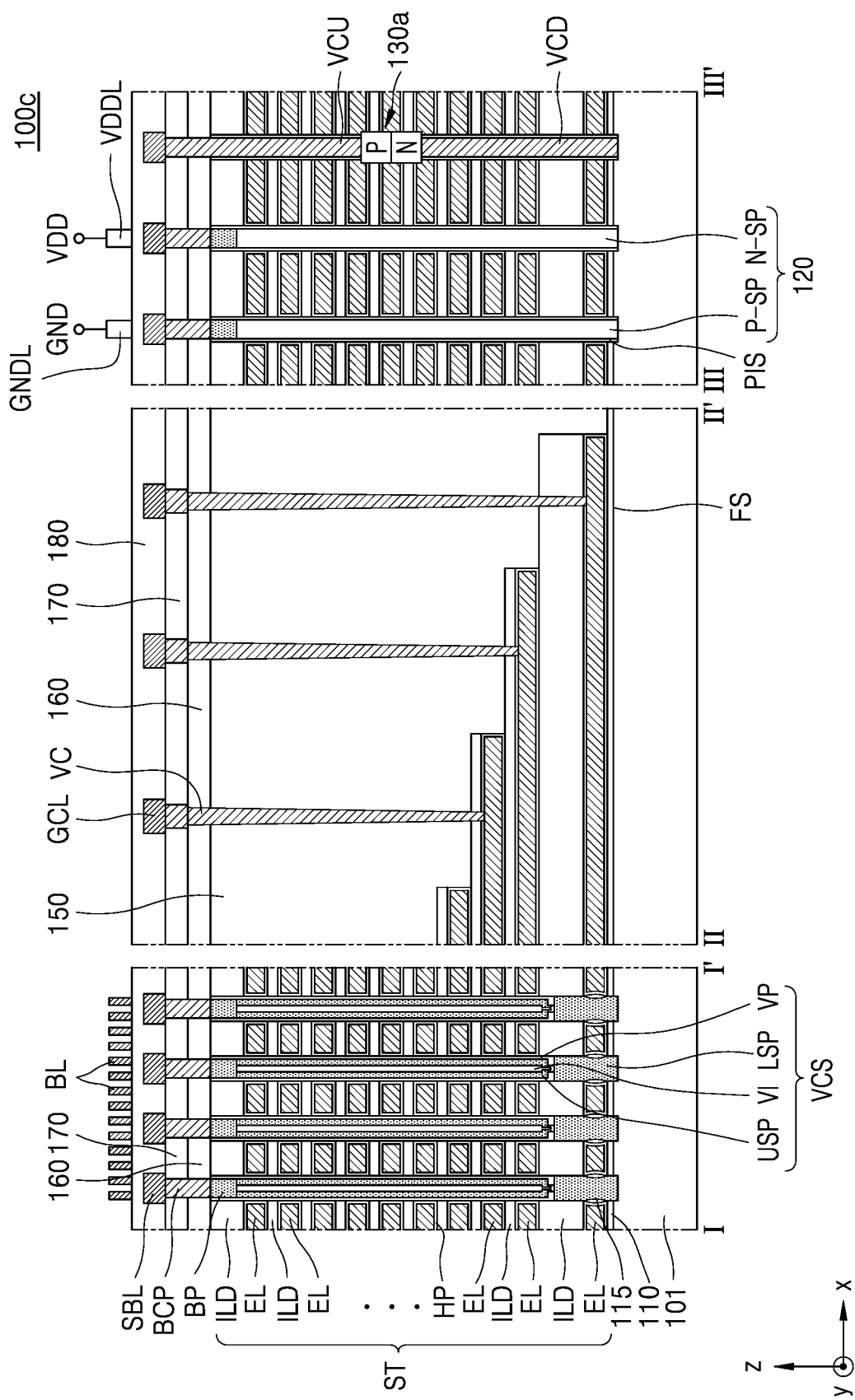

FIGS. 6A and 6B are cross-sectional views of a memory device according to embodiments of the inventive concept. A description already made with reference to FIGS. 1 through 5B will be simplified or omitted.

Referring to FIG. 6A, a memory device 100b according to the current embodiment of the inventive concept may be different from the memory device 100 of FIG. 1 in further including a temperature sensor 130 in the substrate 101. More specifically, in the memory device 100b according to the current embodiment of the inventive concept, the temperature sensor 130 based on a P-N diode may be arranged in the substrate 101. In general, an I-V graph of the P-N diode may vary with a temperature. More specifically, a current or slope at a certain voltage of the I-V graph of the P-N diode may vary according to temperature. Thus, by quantizing the current or slope at a certain voltage of the I-V graph of the P-N diode according to temperature, the temperature may be measured through the P-N diode. For example, in FIG. 6A, by applying a voltage to the temperature sensor 130 based on the P-N diode through an upper vertical contact VCU and the substrate 101 and detecting current, the temperature of a part of the substrate 101 in which the temperature sensor 130 is arranged may be measured.

Referring to FIG. 6B, a memory device 100c according to the current embodiment of the inventive concept may be different from the memory device 100b of FIG. 6A in that a temperature sensor 130a based on a P-N diode is arranged in a part of the stacked structure ST. More specifically, in the memory device 100c according to the current embodiment of the inventive concept, the temperature sensor 130a based on the P-N diode may be arranged in the stacked structure ST. An operation principle of the temperature sensor 130a is the same as described with reference to FIG. 6A. By applying a voltage to the temperature sensor 130a through the upper vertical contact VCU, the substrate 101, and the lower vertical contact VCD and detecting current, the temperature of the part of the stacked structure ST in which the temperature sensor 130a is arranged may be measured.

The memory device according to the current embodiment of the inventive concept may control the thermoelectric device 120 by using the temperature sensors 130 and 130a based on a P-N diode of FIGS. 6A and 6B. However, in the memory device according to the current embodiment of the inventive concept, the temperature sensor may not be limited to the temperature sensor based on a P-N diode. A position in which the temperature sensor is arranged may not be limited to the ones illustrated in FIGS. 6A and 6B. For example, in the memory device according to the current embodiment of the inventive concept, various types of temperature sensors may be arranged in various positions of the memory device to measure temperature, thereby controlling the thermoelectric device 120.

Figure 7:
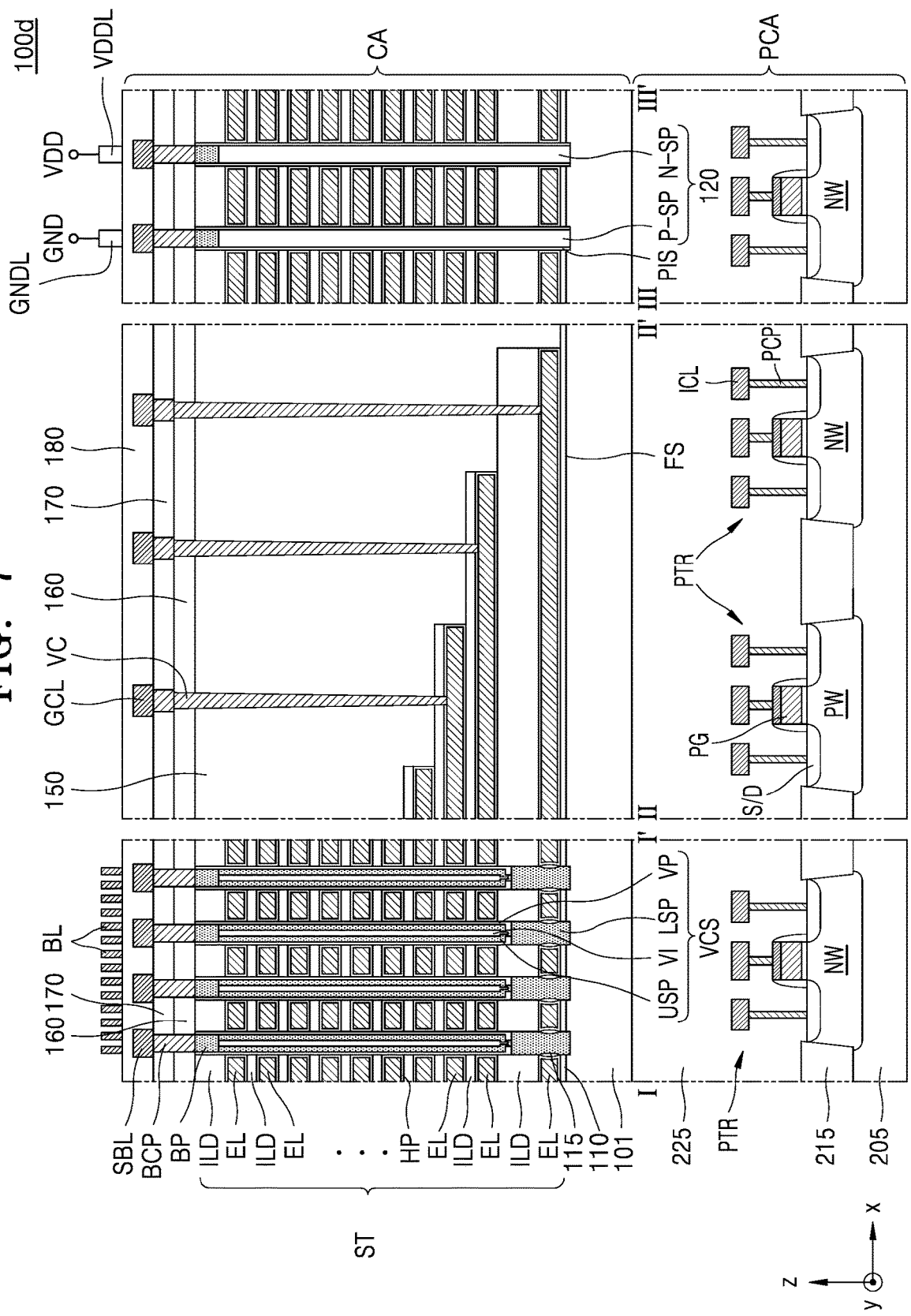
FIG. 7 is a cross-sectional view of a vertical non-volatile memory device according to an embodiment of the inventive concept.

FIG. 7 is a cross-sectional view of a memory device according to an embodiment of the inventive concept. A description already made with reference to FIGS. 1 through 6B will be simplified or omitted.

Referring to FIG. 7, a memory device 100d according to the current embodiment of the inventive concept may include a cell area CA and a peripheral circuit area PCA. The cell area CA may include, for example, the cell array area CCA and the extension area EA of the memory device 100 of FIG. 2A. Thus, in FIG. 7, a part corresponding to the cell area CA may be substantially the same as the portion I-I', the portion II-II', and the portion III-III' of FIG. 2A. The structure of the cell area CA of the memory device 100d according to the current embodiment of the inventive concept is not limited to the structure of the cell area CA of the memory device 100 of FIG. 2A.

In the memory device 100d according to the current embodiment of the inventive concept, the peripheral circuit area PCA may be arranged under the substrate 101 of the cell area CA. In other words, the cell area CA may be stacked on the peripheral circuit area PCA. Thus, the peripheral circuit area PCA and the cell area CA may overlap each other. Likewise, the structure or memory device in which the cell area CA is arranged on the peripheral circuit area PCA may be referred to as a cell on Peri (COP) structure or COP memory device. For reference, in the vertical non-volatile memory device 100 of FIG. 2A, the peripheral circuit area may be arranged near the cell area on a top surface FS of the substrate 101 in the horizontal direction.

The peripheral circuit area PCA may be formed on a base substrate 205. The base substrate 205 may be as described above regarding the substrate 101 of the vertical non-volatile memory device 100 of FIG. 2A. The base substrate 205 may include an n-well area NW doped with n-type impurities and a p-well area PW doped with p-type impurities. In the n-well area NW and the p-well area PW, active areas may be defined by a device isolation layer 215.

In the peripheral circuit area PCA, a high-voltage and/or low-voltage transistor and a passive element such as a resistor, a capacitor, etc., may be arranged. More specifically, the peripheral circuit area PCA may include a peripheral circuit gate electrode PG, a source/drain area S/D, a peripheral circuit plug PCP, a peripheral circuit line ICL, and a lower buried insulation layer 225. The lower buried insulation layer 225 may be formed as a single layer or multiple layers. A p-channel metal-oxide semiconductor (PMOS) transistor may be formed on the n-well area NW and an n-channel MOS (NMOS) transistor may be formed on the p-well area PW.

Although not shown, a through-via line area may be arranged in the cell array area CAA or the extension area EA. A through-via may be formed in the through-via line area, and lines on the cell array area CAA or the extension area EA may be connected to lines of the peripheral circuit area PCA through the through-via. In addition, the substrate 101 may be formed of polysilicon. For example, a substrate trench area may be formed in an upper portion of the lower buried insulation layer 225 and the trench area may be filled with polysilicon, thus forming the substrate 101. As such, when the substrate 101 is formed of polysilicon, the peripheral circuit area PCA may be formed on the lower base substrate 205 and the substrate 101 may be formed in the lower buried insulation layer 225. Thereafter, the cell array area CAA and the extension area EA may be formed on the substrate 101 and the through-via may be formed in the through-via line area, thus implementing a COP structure.

Figure 8:
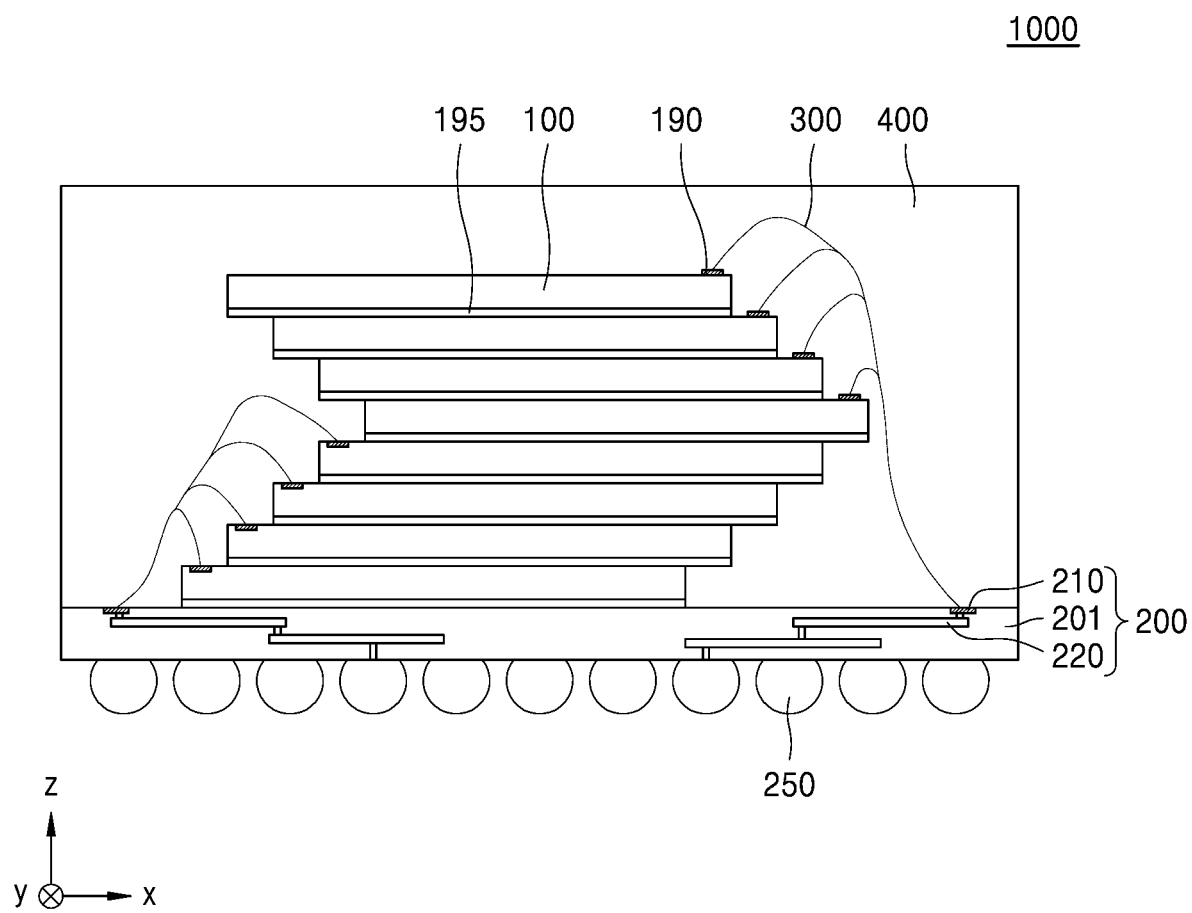
FIG. 8 is a cross-sectional view of a semiconductor package including a vertical non-volatile memory device according to an embodiment of the inventive concept.

FIG. 8 is a cross-sectional view of a semiconductor package including a vertical non-volatile memory device according to an embodiment of the inventive concept. A description will be made with reference to FIGS. 1 through 2B together and a description already made with reference to FIGS. 1 through 7 will be simplified or omitted.

Referring to FIG. 8, a semiconductor package 1000 including a vertical non-volatile memory device according to the current embodiment of the inventive concept (hereafter, simply referred to as a 'semiconductor package') may include the package substrate 200, the semiconductor chip 100, the external connection line 300, and a sealant 400.

The package substrate 200 may include a body layer 201, the substrate pad 210, and the internal line 220. The body layer 201 may be formed of various materials. For example, the body layer 201 may be formed of silicon, ceramic, an organic material, glass, epoxy resin, etc., according to a type of the package substrate 200. In the semiconductor package 1000 according to the current embodiment of the inventive concept, the package substrate 200 may be a printed circuit board (PCB) based on epoxy resin. The internal line 220 may be arranged in the body layer 201 and may be formed as a single layer or multiple layers. The substrate pad 210 may be electrically connected to the external connection terminal 250 on the bottom surface through the internal line 220. A protection layer such as a solder resist SR may be formed on a top surface and a bottom surface of the body layer 201.

The external connection terminal 250 may be arranged on a bottom surface of the package substrate 200. The external connection terminal 250 may be formed of, for example, a solder ball. The external connection terminal 250 may include data signal terminals, command/address signal terminals, and power/ground terminals. The data signal terminals and the command/address terminals may be arranged separately for each area on the bottom surface of the package substrate 200. The power/ground terminals may be arranged more or less randomly between the data signal terminals and the command/address signal terminals on the bottom surface of the package substrate 200. The external connection terminal 250 may include dummy connection terminals that do not function electrically. The dummy connection terminals may be arranged for warpage improvement, heat dissipation, additional power/ground application, etc., of the package substrate 200.

The semiconductor chip 100 may be the memory device 100 of FIG. 2A. Thus, the semiconductor chip 100 may include the thermoelectric device 120 in the cell array area CAA. However, the semiconductor chip 100 may not be limited to the memory device 100 of FIG. 2A. For example, the semiconductor chip 100 may be any one of the memory devices 100a through 100d of FIGS. 5B through 7.

The semiconductor chip 100 may be stacked in plural on the package substrate 200. For example, eight semiconductor chips 100 may be stacked on the package substrate 200. However, the number of semiconductor chips 100 stacked on the package substrate 200 is not limited to 8. For example, one or more semiconductor chips 100 may be stacked in multiple stages on the package substrate 200.

The semiconductor chip 100 may be fixed by being stacked on the package substrate 200 and the corresponding lower semiconductor chip 100 through an adhesive layer 195 such as a die attach film (DAF) or a non-conductive film (NCR). In addition, the semiconductor chip 100 may be mounted as a wire bonding structure on the package substrate 200. Thus, in the semiconductor chip 100, an active surface may be directed upward and the chip pad 190 may be exposed upward.

To expose the chip pad 190 upward, the semiconductor chip 100 may be stacked as a step structure in the first direction x. For example, as shown in FIG. 8, each of first through fifth semiconductor chips 100 may stacked to the right by a certain distance and each of sixth through eighth semiconductor chips 100 may be stacked to the left by the certain distance. As the semiconductor chips 100 are stacked in a step structure or a cascade structure, the first through fourth semiconductor chips 100 may be wire-bonded through a left side and the fifth through eighth semiconductor chips 100 may be wire-bonded through a right side.

The external connection line 300 may electrically connect the semiconductor chips 100 to the package substrate 200. The external connection line 300 may be, for example, a bonding wire, and connect the chip pad 190 of the semiconductor chip 100 to the substrate pad 210 of the package substrate 200.

The sealant 400 may seal the semiconductor chips 100 to protect the semiconductor chips 100 from an external physical and electrical shock. The sealant 400 may be formed of polymer such as resin. For example, the sealant 400 may be formed of an epoxy molding compound (EMC).

In the semiconductor package 1000 according to the current embodiment of the inventive concept, the semiconductor chip 100 may include the thermoelectric device 120 therein and perform heat dissipation in a chip level through the thermoelectric device 120, thereby stably maintaining the operating temperature of the memory device in the chip level. In the semiconductor package 1000 according to the current embodiment of the inventive concept, a heat dissipation path based on the thermoelectric device 120 may be as described below. For example, the N-type semiconductor pillar N-SP of the thermoelectric device 120 may be connected to the chip pad 190 through the first internal connection line 1st-INC, and the chip pad 190 may be connected to the power source VDD through the external connection line 300, the substrate pad 210, the internal line 220 of the package substrate 200, and the external connection terminal 250. The P-type semiconductor pillar P-SP of the thermoelectric device 120 may be connected to the chip pad 190 through the second internal connection line 2nd-INC, and the chip pad 190 may be connected to the ground GND through the external connection line 300, the substrate pad 210, the internal line 220 of the package substrate 200, and the external connection terminal 250. Based on such a connection relationship of the thermoelectric device 120, heat may be transferred toward the power source VDD and the ground GND, such that heat dissipation may occur beyond the N-type semiconductor pillar N-SP and the P-type semiconductor pillar P-SP and in particular, much heat dissipation may occur in the external connection terminal 250 contacting the air.

The first internal connection line 1st-INC and the second internal connection line 2nd-INC have been separately described, but the chip pad 190, the external connection line 300, the substrate pad 210, the internal line 220 of the package substrate 200, and the external connection terminal 250 may also be separated as a group connected to the first internal connection line 1st-INC and a group connected to the second internal connection line 2nd-INC. As will be described in the following description to be made with reference to FIGS. 10A and 10B, according to an embodiment of the inventive concept, at least one of the chip pad 190, the external connection line 300, the substrate pad 210, the internal line 220 of the package substrate 200, or the external connection terminal 250 may be a dummy element. Herein, the dummy element may mean lines, pads, and terminals capable of supplying power and ground regardless of an operation of the cell array area.

FIGS. 9A through 10B are cross-sectional views of a semiconductor package according to embodiments of the inventive concept. A description will be made with reference to FIGS. 1 through 2B together and a description already made with reference to FIG. 8 will be simplified or omitted.

Figure 9A:
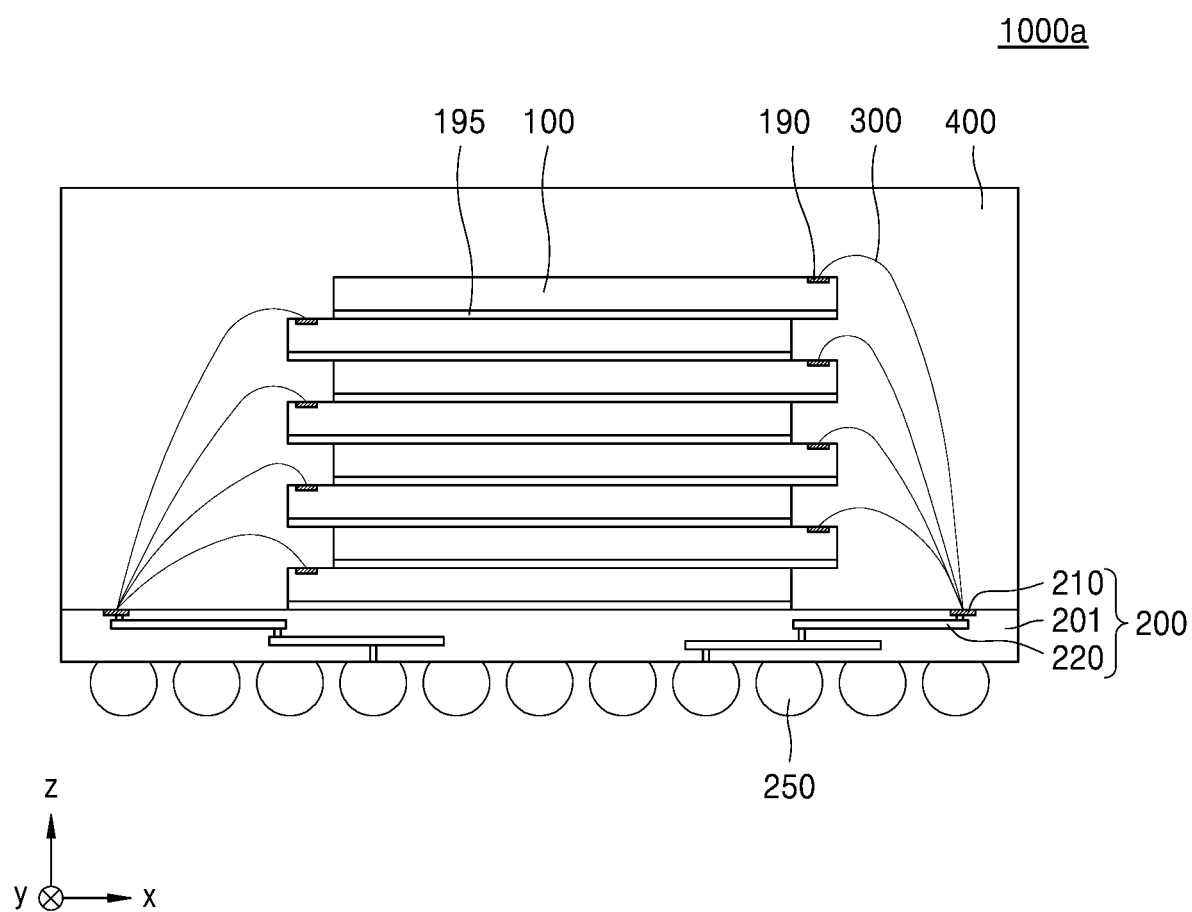
FIGS. 9A, 9B, 10A and 10B are cross-sectional views of a semiconductor package according to embodiments of the inventive concept.

Referring to FIG. 9A, a semiconductor package 1000$a$ according to the current embodiment of the inventive concept may be different from the semiconductor package 1000 of FIG. 8 in view of a stacked structure of the semiconductor chip 100. More specifically, in the semiconductor package 1000$a$ according to the current embodiment of the inventive concept, the semiconductor chips 100 may be stacked in a zigzag structure in the first direction x. As the semiconductor chips 100 are stacked in the zigzag structure, the first, third, fifth, and seventh semiconductor chips 100 may be wire-bonded through a left side and the second, fourth, sixth, and eighth semiconductor chips 100 may be wire-bonded through a right side.

When the semiconductor chips 100 has a rectangular structure having a longer side and the chip pad 190 is arranged in opposite short sides, the semiconductor chips 100 may be stacked by being arranged alternately in a cross shape, thereby implementing a wire-bonding structure.

Figure 9B:
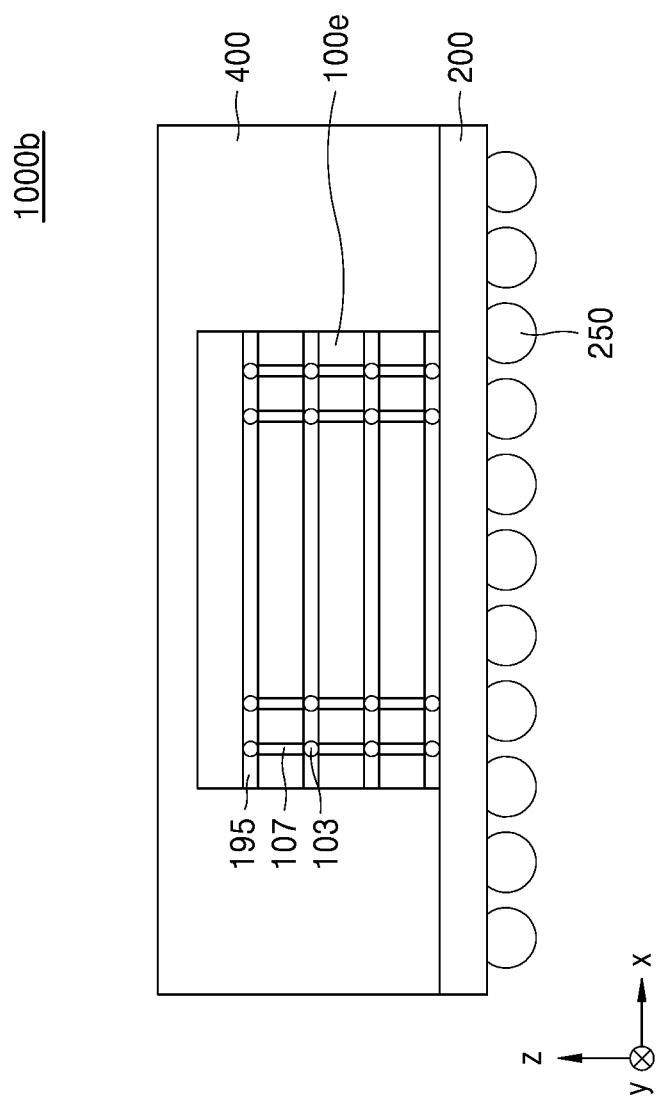

Referring to FIG. 9B, a semiconductor package 1000$b$ according to the current embodiment of the inventive concept may be different from the semiconductor package 1000 of FIG. 8 in that a semiconductor chip 100$e$ includes a through electrode 107 therein, through which the semiconductor chip 100$e$ is electrically connected to the package substrate 200. More specifically, in the semiconductor package 1000$b$ according to the current embodiment of the inventive concept, the semiconductor chip 100$e$ may include the through electrode 107 and may be mounted on the package substrate 200 and the corresponding lower semiconductor chip 100$e$ through a minute bump 103 and the adhesive layer 195. In the semiconductor chip 100$e$, an active surface may be directed downward and the chip pad 190 may be directed downward. The semiconductor chip 100$e$ may be electrically connected to the package substrate 200 through the through electrode 107 and the minute bump 103.

In the semiconductor package 1000$b$ according to the current embodiment of the inventive concept, four semiconductor chips 100$e$ are stacked, but the number of semiconductor chips 100$e$ stacked on the package substrate 200 is not limited to 4. For example, one through three, or five or more semiconductor chips 100$e$ may be stacked on the package substrate 200. As shown in FIG. 9B, the semiconductor chip 100$e$ arranged on a top portion may not include a through electrode.

In the semiconductor package 1000$b$ according to the current embodiment of the inventive concept, the semiconductor chip 100$e$ may include the thermoelectric device 120 which may be connected to a substrate pad of the package substrate 200 through the through electrode 107 and the minute bump 103. In the semiconductor package 1000$b$ according to the current embodiment of the inventive concept, a heat dissipation path based on the thermoelectric device 120 may be as described below. For example, the N-type semiconductor pillar N-SP of the thermoelectric device 120 may be connected to the chip pad through the first internal connection line 1st-INC, and the chip pad may be connected to the power source VDD through the through electrode 107 and the minute bump 103, the substrate pad, the internal line of the package substrate 200, and the external connection terminal 250. In addition, the P-type semiconductor pillar P-SP of the thermoelectric device 120 may be connected to the chip pad through the second internal connection line 2nd-INC, and the chip pad may be connected to the ground GND through the through electrode 107 and the minute bump 103, the substrate pad, the internal line of the package substrate 200, and the external connection terminal 250. Based on such a connection relationship of the thermoelectric device 120, heat may be transferred to the power source VDD and the ground GND.

Figure 10A:
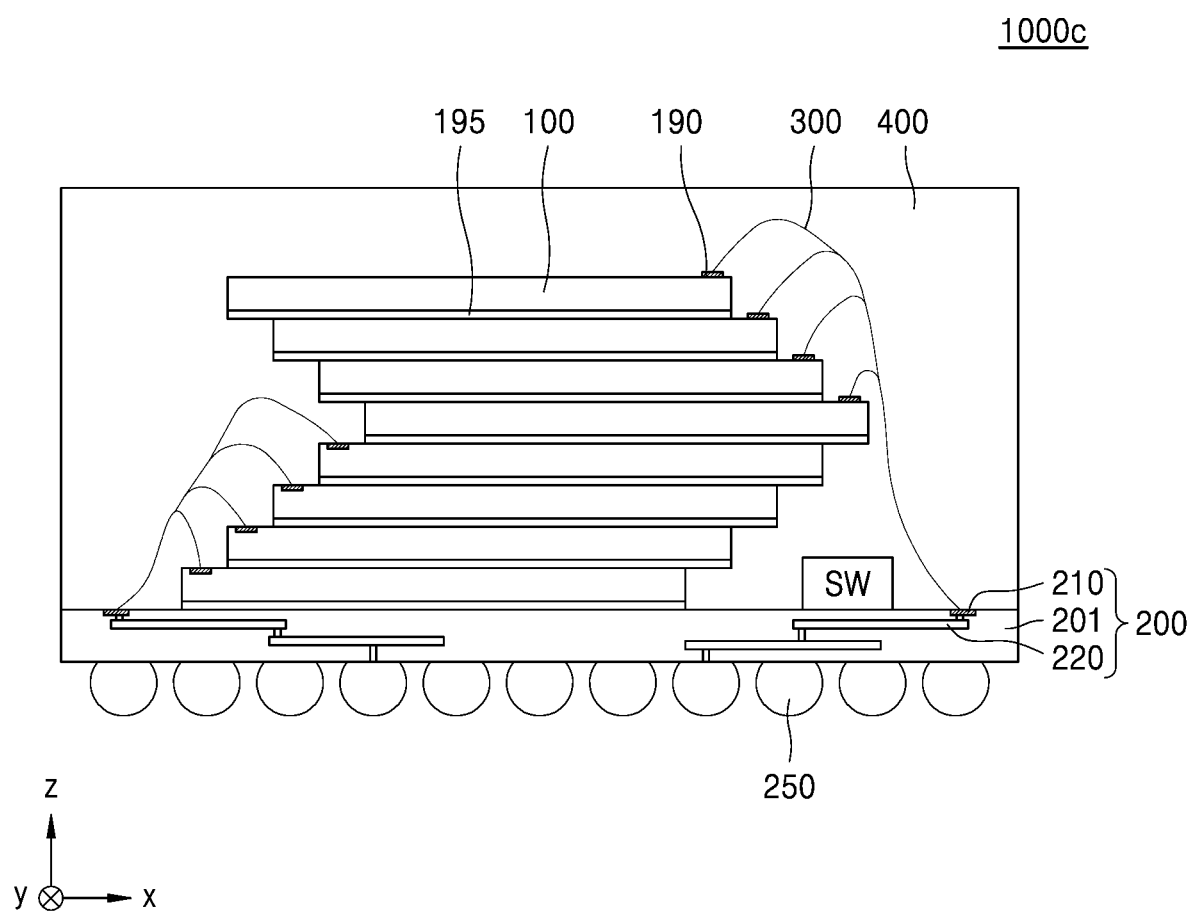

Referring to FIG. 10A, a semiconductor package 1000$c$ according to the current embodiment of the inventive concept may be different from the semiconductor package 1000 of FIG. 8 in further including a switching element SW. More specifically, in the semiconductor package 1000$c$ according to the current embodiment of the inventive concept, the switching element SW may be arranged on the package substrate 200. The substrate pad 210 may be connected to the internal line 220 of the package substrate 200 through the switching element SW. The external connection line 300 may be selectively connected to the external connection terminal 250 connected to the power source VDD and the ground GND by switching of the switching element SW. As a result, the external connection line 300, the chip pad 190, etc., connected to the power source VDD and the ground GND through the switching element SW, may correspond to dummy elements.

While it is described with reference to FIG. 10A that the switching element SW is arranged on the package substrate 200 to connect the substrate pad 210 with the internal line 220, the switching element SW may be in various spots such that elements connected through the switching element SW may correspond to dummy elements. The switching element SW may be arranged outside the semiconductor package and in this case, the external connection terminal 250 through to the chip pad 190 may correspond to the dummy elements.

The switching element SW may operate by a temperature measured by a temperature sensor (see 130 of FIG. 6A) arranged inside the semiconductor chip 100. For example, when the temperature measured by the temperature sensor 130 exceeds the reference temperature, the switching element SW may operate such that the power source VDD and the ground GND may be connected to the semiconductor pillars N-SP and P-SP.

Figure 10B:
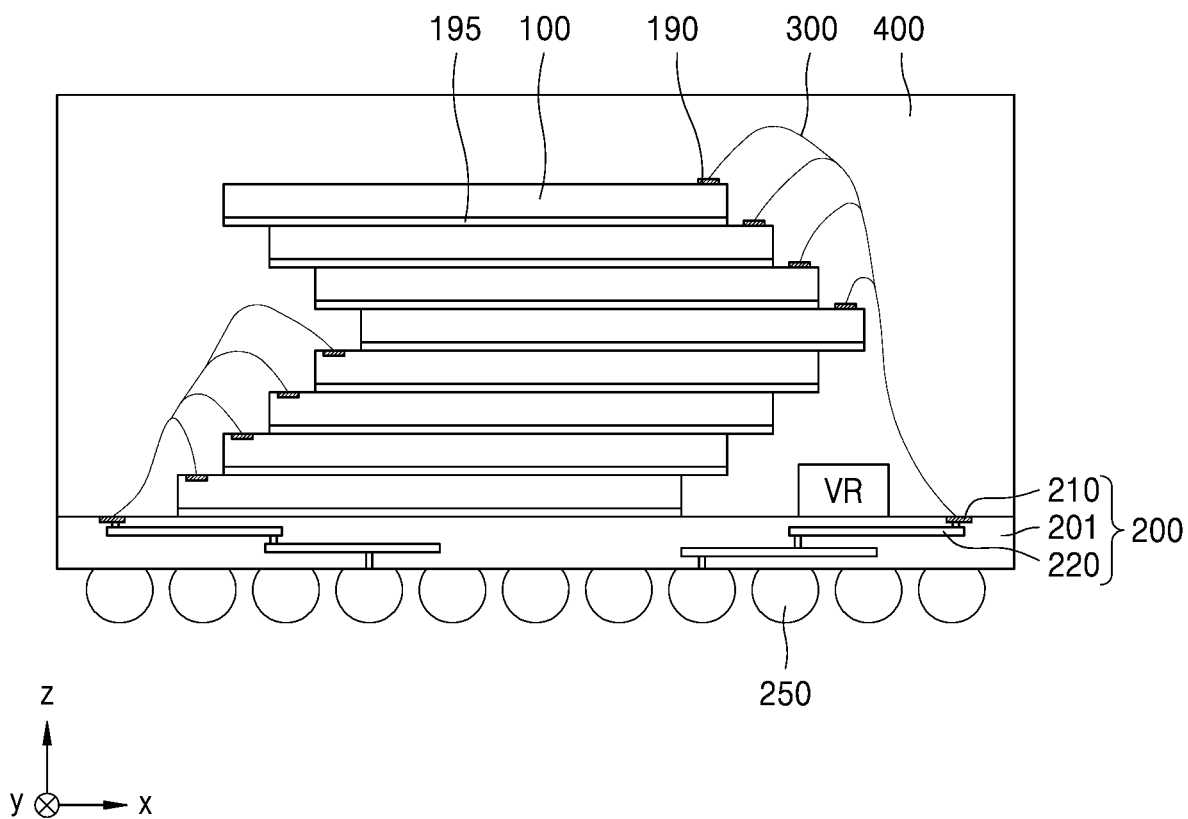

Referring to FIG. 10B, a semiconductor package 1000$d$ according to the current embodiment of the inventive concept may be different from the semiconductor package 1000 of FIG. 8 in further including a voltage regulator VR. More specifically, in the semiconductor package 1000$d$ according to the current embodiment of the inventive concept, the voltage regulator VR may be arranged on the package substrate 200. The voltage regulator VR may regulate a voltage level to a desired level. The voltage regulator VR may include, for example, a control circuit and a switching logic circuit. The control circuit may include a plurality of transistors for voltage regulation, and the switching logic circuit may include at least two transistors for selecting a path of electric current. The switching logic circuit of the voltage regulator VR may function as the switching element SW of FIG. 10A. The semiconductor package 1000$d$ according to the current embodiment of the inventive concept may include the voltage regulator VR to apply power of appropriate voltage to the thermoelectric device 120 for optimal heat dissipation.

Figure 11:
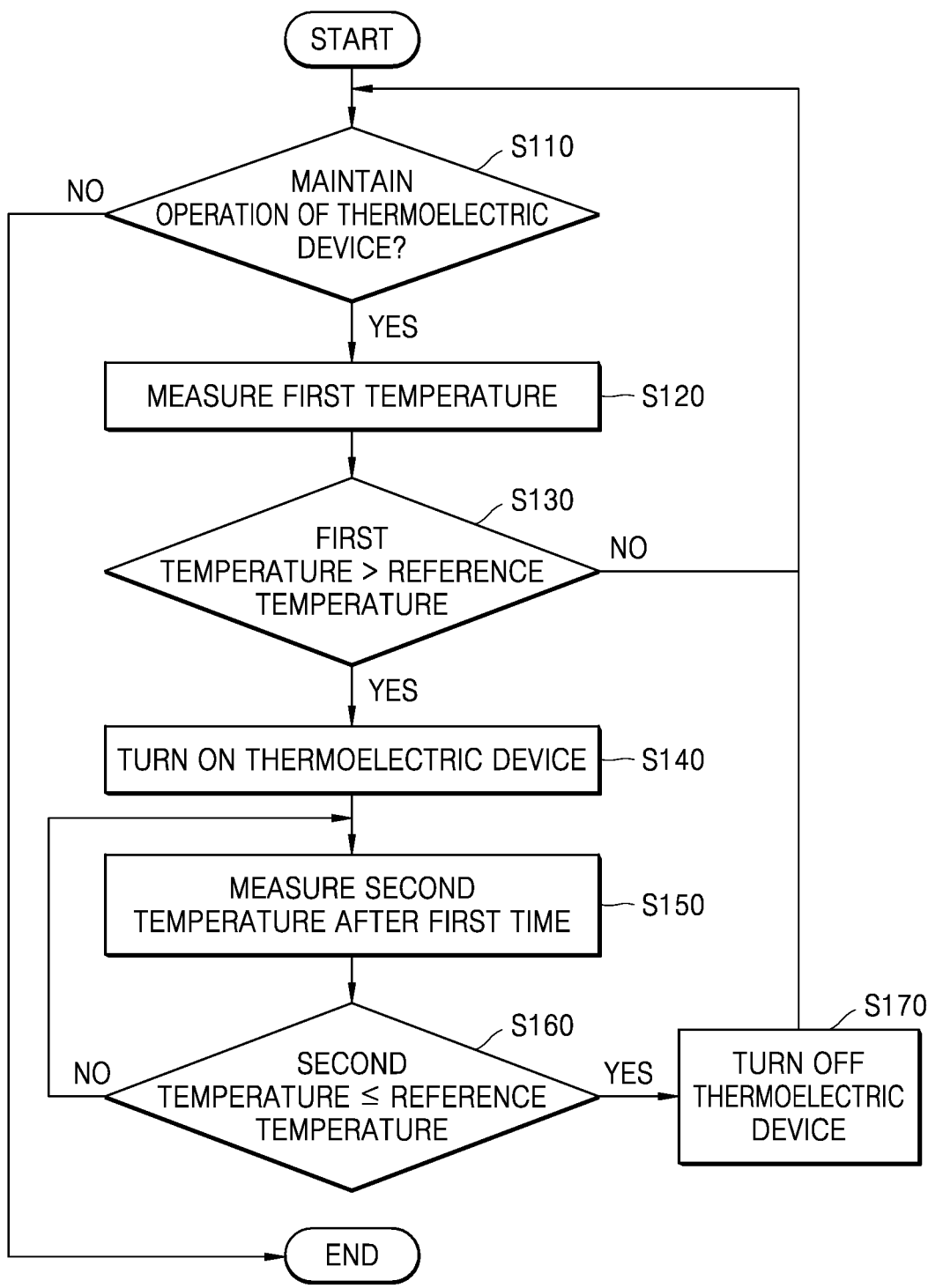
FIG. 11 is a flowchart illustrating a heat dissipation method of a vertical non-volatile memory device, according to an embodiment of the inventive concept.

FIG. 11 is a flowchart illustrating a heat dissipation method of a vertical non-volatile memory device, according to an embodiment of the inventive concept. A description will be made with reference to FIGS. 1 through 2B together and a description already made with reference to FIGS. 1 through 7 will be simplified or omitted.

Referring to FIG. 11, in a heat dissipation method of a vertical non-volatile memory device (hereinafter, simply referred to as a 'heat dissipation method') according to the current embodiment of the inventive concept, the memory device 100 may determine whether to maintain an operation of the thermoelectric device 120 in operation S110. Herein, the memory device 100, which is the memory device 100 of FIG. 2A, may include the thermoelectric device 120 in the cell array area CAA. Operation of the thermoelectric device 120 may be determined based on various causes such as amount of use (or non-use) of the memory device 100 or an operating age of the memory device 100 in a home appliance, a defect of the memory device 100, etc.

When the thermoelectric device 120 maintains the operation in S110 (Yes), a first temperature of the substrate 101 and/or the stacked structure ST may be measured through the temperature sensor (see 130 of FIG. 6A) in operation S120. When the thermoelectric device 120 does not maintain the operation in S110 (No), a heat dissipation operation may be terminated by the thermoelectric device 120 to finish the heat dissipation method.

After the first temperature is measured in operation S120, it is determined whether the first temperature exceeds the reference temperature in operation S130. Herein, the reference temperature may be determined based on an operating temperature of the memory device 100, a maximum allowable temperature, etc. When the first temperature exceeds the reference temperature (Yes) in operation S130, the thermoelectric device 120 may be turned on in operation S140. For example, the power source VDD may be connected to the N-type semiconductor pillar N-SP of the thermoelectric device 120 and the ground GND may be connected to the P-type semiconductor pillar P-SP, thereby performing a heat dissipation operation. Connection between the power source VDD and the ground GND may be performed through the switching element (see SW of FIG. 10A). As the thermoelectric device 120 is turned on, the substrate 101 and/or the stacked structure ST may be heat-dissipated and cooled such that the temperature of the substrate 101 and/or the stacked structure ST may decrease. When the first temperature is less than or equal to the reference temperature (No) in operation S130, the operation S110 of determining whether to maintain the operation of the thermoelectric device 120 may be performed.

After the thermoelectric device 120 is turned on in operation S140, a second temperature of the substrate 101 and/or the stacked structure ST may be measured through the temperature sensor 130 after a set first time period in operation S150. Herein, the first time period may be set based on performance and temperature decreasing speed of the thermoelectric device 120, for example. After the second temperature is measured in operation S150, it is determined whether the second temperature is less than or equal to the reference temperature in operation S160. When the second temperature is less than or equal to the reference temperature (Yes) in operation S160, the thermoelectric device 120 may be turned off in operation S170. For example, connection of the power source VDD to the N-type semiconductor pillar N-SP of the thermoelectric device 120 and connection of the ground GND to the P-type semiconductor pillar P-SP may be released (i.e., disconnected). Disconnection of the power source VDD and the ground GND from the semiconductor pillars N-SP and P-SP may also be made by the switching element SW. According to an embodiment of the inventive concept, the reference temperature to be compared with the second temperature may be set lower than the reference temperature to be compared with the first temperature. After the thermoelectric device 120 is turned off, the operation S110 of determining whether to maintain the operation of the thermoelectric device 120 may be performed. When the second temperature exceeds the reference temperature (No), the operation S150 of measuring the second temperature may be performed.

While the inventive concept has been particularly shown and described with reference to embodiments thereof, it will be understood that various changes in form and details may be made therein without departing from the principles of the present disclosure.

What is claimed is:

1. A vertical non-volatile memory device comprising:
   a substrate on which a cell array area and an extension area are defined, the extension area including an electrode pad extending from the cell array area in a first direction;
   a vertical channel structure formed on the substrate to extend perpendicular to a top surface of the substrate;
   a thermoelectric device on the substrate, the thermoelectric device comprising at least two semiconductor pillars extending perpendicular to the top surface of the substrate; and
   a stacked structure on the substrate, the stacked structure comprising a gate electrode layer and an interlayer insulation layer which are stacked alternately along sidewalls of the vertical channel structure and along sidewalls of the at least two semiconductor pillars,
   wherein the sidewalls of the vertical channel structure and the sidewalls of the at least two semiconductor pillars extend perpendicular to the top surface of the substrate, and
   wherein the at least two semiconductor pillars comprise an n-type semiconductor pillar and a p-type semiconductor pillar which are electrically connected to each other through a conductive layer on the substrate.

2. The vertical non-volatile memory device of claim 1, wherein each of the n-type semiconductor pillar and the p-type semiconductor pillar is connected, through a lower end thereof, to the conductive layer, and
   when the thermoelectric device is turned on, the n-type semiconductor pillar is connected to a power source through a top end thereof, the p-type semiconductor pillar is connected to ground through a top end thereof, and heat from the substrate is dissipated through the at least two semiconductor pillars.

3. The vertical non-volatile memory device of claim 1, wherein the at least two semiconductor pillars comprise a plurality of n-type semiconductor pillars and a plurality of p-type semiconductor pillars which are arranged in a second direction perpendicular to the first direction, and
   the plurality of n-type semiconductor pillars and the plurality of p-type semiconductor pillars are arranged collectively for the same conductive type in the second direction or are arranged alternately in the second direction.

4. The vertical non-volatile memory device of claim 3, wherein the plurality of n-type semiconductor pillars are connected, through a top end thereof, in common to a first line and the first line is connected to a first chip pad connected to a power source, and the plurality of p-type semiconductor pillars are connected, through a top end thereof, in common to a second line and the second line is connected to a second chip pad connected to ground.

5. The vertical non-volatile memory device of claim 1, wherein each of the at least two semiconductor pillars has a cylindrical shape and a side surface thereof is surrounded by a pillar insulation layer.

6. The vertical non-volatile memory device of claim 1, wherein a common source line (CSL) is arranged on the substrate, and
each of the n-type semiconductor pillar and the p-type semiconductor pillar contacts, through a lower end thereof, the common source line.

7. The vertical non-volatile memory device of claim 1, wherein, when the n-type semiconductor pillar is connected, through a top end thereof, to a power source and the p-type semiconductor pillar is connected, through a top end thereof, to ground, carriers of the n-type semiconductor pillar move to the power source and carriers of the p-type semiconductor pillar move to the ground, and
heat generated in the substrate and the stacked structure is dissipated by moving to the power source and the ground by the carriers.

8. The vertical non-volatile memory device of claim 1, wherein at least one temperature sensor based on a diode is arranged in the cell array area, and
a temperature in the substrate and the stacked structure is measured using the at least one temperature sensor.

9. The vertical non-volatile memory device of claim 8, wherein, when the temperature measured using the at least one temperature sensor exceeds a set reference temperature, the thermoelectric device is turned on and operates.

10. A vertical non-volatile memory device comprising:
a substrate on which a cell array area and an extension area are defined, the extension area includes an electrode pad extending from the cell array area in a first direction;
a vertical channel structure formed on the substrate by extending perpendicular to a top surface of the substrate;
a thermoelectric device on the substrate, the thermoelectric device comprising at least two semiconductor pillars extending perpendicular to the top surface of the substrate;
a stacked structure on the substrate, the stacked structure comprising a gate electrode layer and an interlayer insulation layer which are stacked alternately along sidewalls of the vertical channel structure and along sidewalls of the at least two semiconductor pillars; and
at least one temperature sensor arranged in the cell array area, on the substrate,
wherein the sidewalls of the vertical channel structure and the sidewalls of the at least two semiconductor pillars extend perpendicular to the top surface of the substrate,
wherein the at least two semiconductor pillars comprise an n-type semiconductor pillar and a p-type semiconductor pillar which are electrically connected to each other through a conductive layer on the substrate, and
when a temperature measured using the at least one temperature sensor exceeds a set reference temperature, the n-type semiconductor pillar is connected, through a top end thereof, to a power source and the p-type semiconductor pillar is connected through a top end thereof, to ground, such that the thermoelectric device is turned on and heat from the substrate is dissipated through the at least two semiconductor pillars.

11. The vertical non-volatile memory device of claim 10, wherein the at least two semiconductor pillars comprise a plurality of n-type semiconductor pillars and a plurality of p-type semiconductor pillars which are arranged in a second direction perpendicular to the first direction, and
the plurality of n-type semiconductor pillars and the plurality of p-type semiconductor pillars are arranged collectively for the same conductive type in the second direction or are arranged alternately in the second direction, and
the plurality of n-type semiconductor pillars are connected to a first chip pad connected to the power source, through a first line, and
the plurality of p-type semiconductor pillars are connected to a second chip pad connected to the ground, through a second line.

12. The vertical non-volatile memory device of claim 10, wherein the at least one temperature sensor is based on a diode and measures a temperature in the substrate and the stacked structure.

* * * * *